(12) United States Patent
Zhang et al.

(10) Patent No.: US 9,530,791 B1
(45) Date of Patent: Dec. 27, 2016

(54) MULTILEVEL MEMORY STACK STRUCTURE WITH JOINT ELECTRODE HAVING A COLLAR PORTION AND METHODS FOR MANUFACTURING THE SAME

(71) Applicant: SANDISK TECHNOLOGIES INC., Plano, TX (US)

(72) Inventors: Yanli Zhang, San Jose, CA (US); Raghuveer S. Makala, Campbell, CA (US); Jin Liu, Milpitas, CA (US); Murshed Chowdhury, Milpitas, CA (US); Yao-Sheng Lee, Tampa, FL (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/883,966

(22) Filed: Oct. 15, 2015

(51) Int. Cl.
*H01L 27/115* (2006.01)

(52) U.S. Cl.
CPC ..... *H01L 27/11582* (2013.01); *H01L 27/1157* (2013.01)

(58) Field of Classification Search
CPC .............. H01L 27/11582; H01L 27/1157
USPC ......................................... 257/324
See application file for complete search history.

(56) References Cited

U.S. PATENT DOCUMENTS

| | | |
|---|---|---|
| 5,915,167 A | 6/1999 | Leedy |
| 7,867,822 B2 * | 1/2011 | Lee ................. H01L 21/2007 257/E21.008 |
| 2011/0287612 A1 | 11/2011 | Lee et al. | |
| 2014/0264525 A1 * | 9/2014 | Takahashi ............. H01L 27/115 257/314 |

OTHER PUBLICATIONS

Endoh et al., "Novel Ultra High Density Memory with a Stacked-Surrounding Gate Transistor (S-SGT) Structured Cell," IEDM Proc. (2001) 33-36.
Hammond, M. L., "Silicon Epitaxy by Chemical Vapor Deposition," pp. 45-106.
Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

* cited by examiner

*Primary Examiner* — Yasser A Abdelaziez
(74) *Attorney, Agent, or Firm* — The Marbury Law Group PLLC

(57) ABSTRACT

A three-dimensional memory device including multiple stack structures can be formed with a joint region electrode, which is an electrode formed at a joint region located near the interface between an upper stack structure and a lower stack structure. A memory stack structure is formed through the multiple stack structures. The joint region electrode laterally surrounds a portion of the memory stack structure in proximity to the interface between different stack structures. The joint region electrode includes a layer portion having a thickness and a collar portion that laterally surrounds the memory stack structure and having a greater vertical extent than the thickness of the layer portion. The increased vertical extent of the collar portion with respect to the vertical extent of the layer portion provides enhanced control of a portion of a semiconductor channel in the memory stack structure located near the interface between different stack structures.

18 Claims, 34 Drawing Sheets

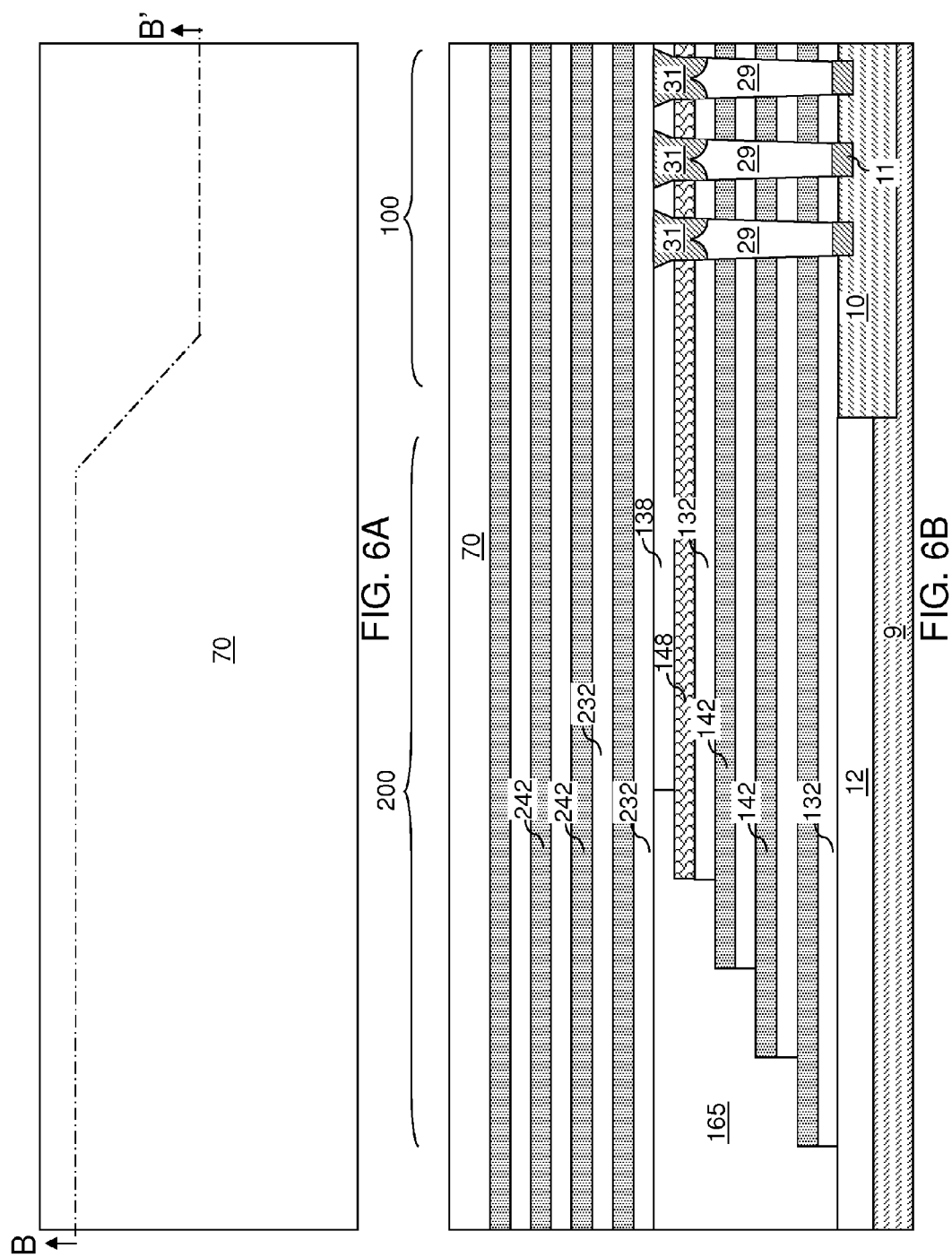

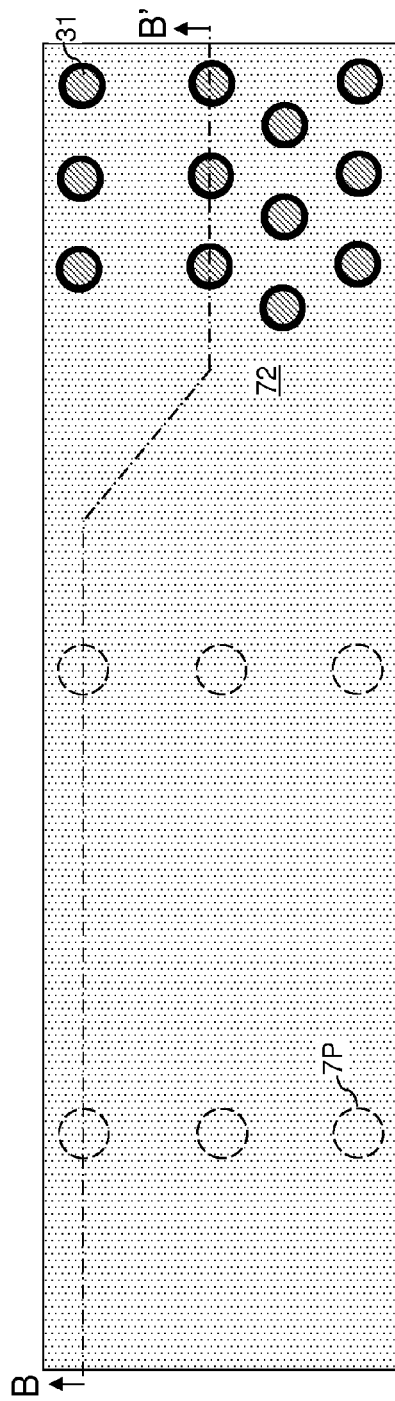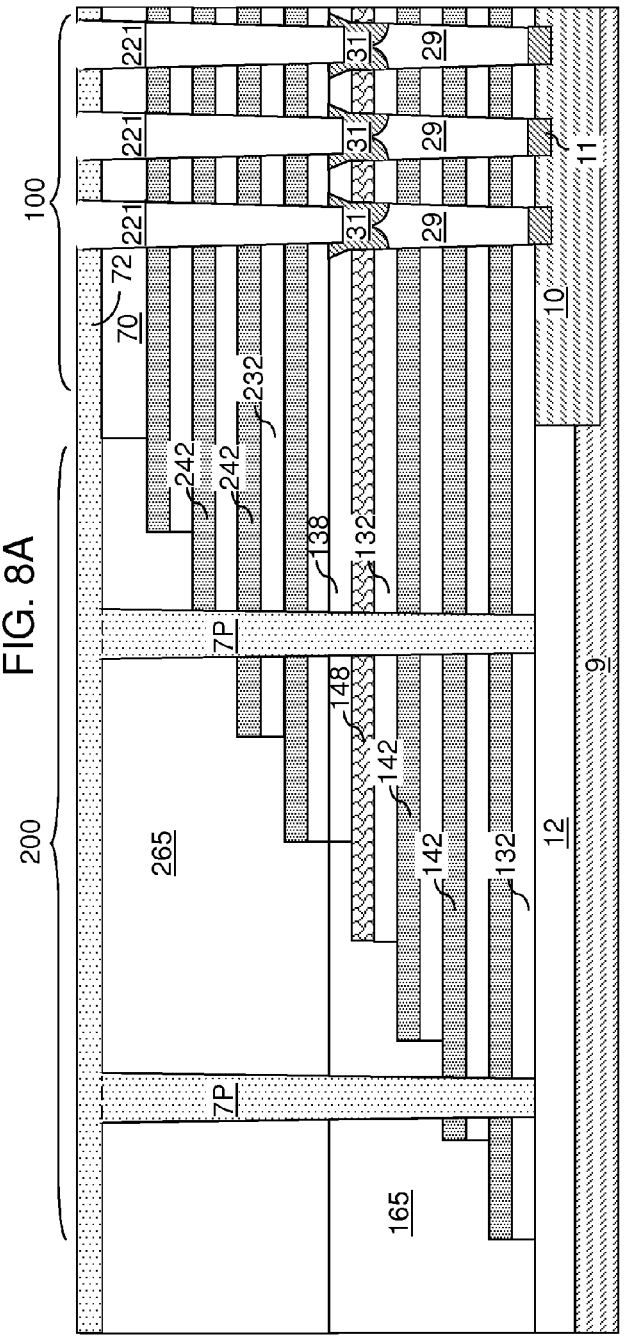
FIG. 8A
FIG. 8B

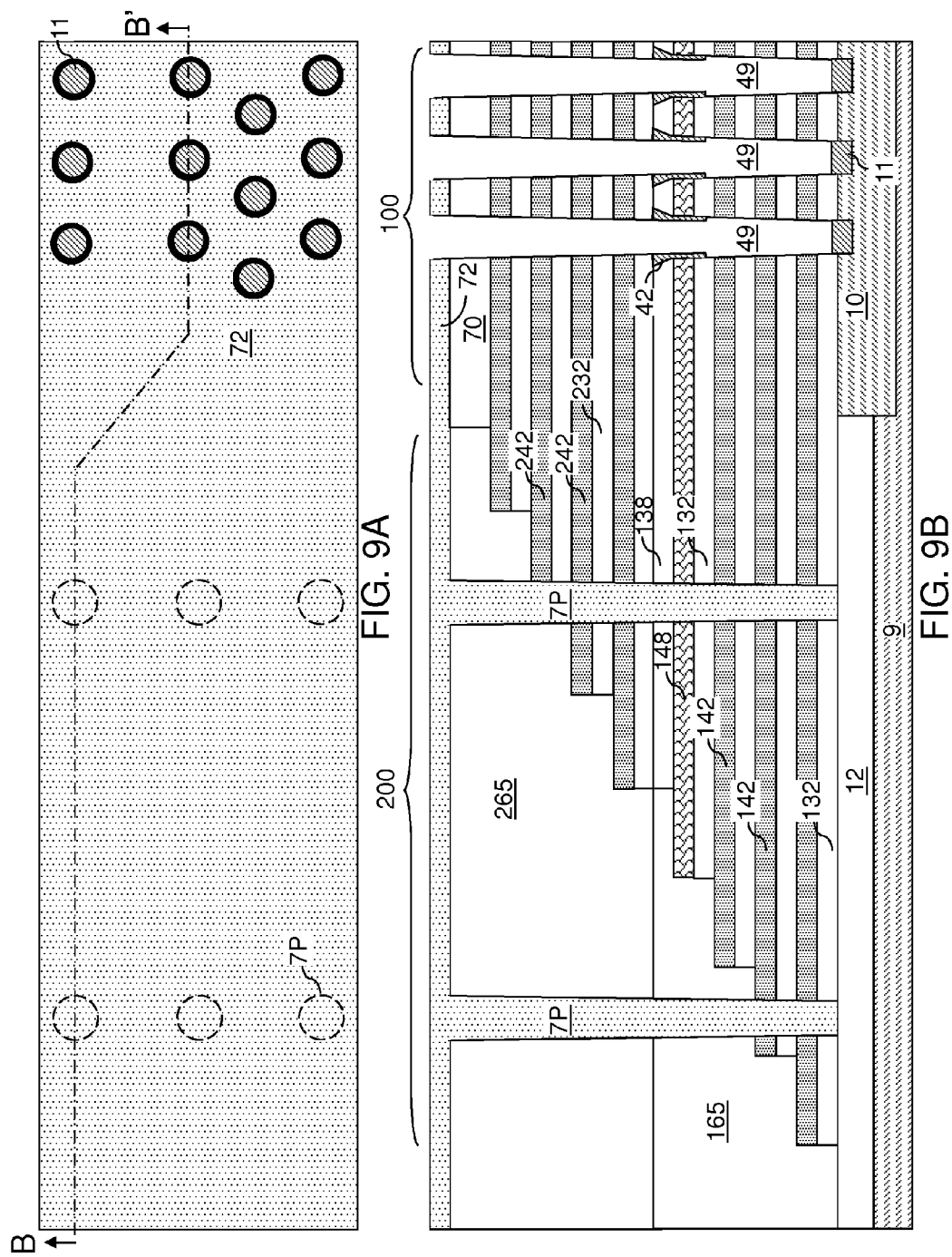

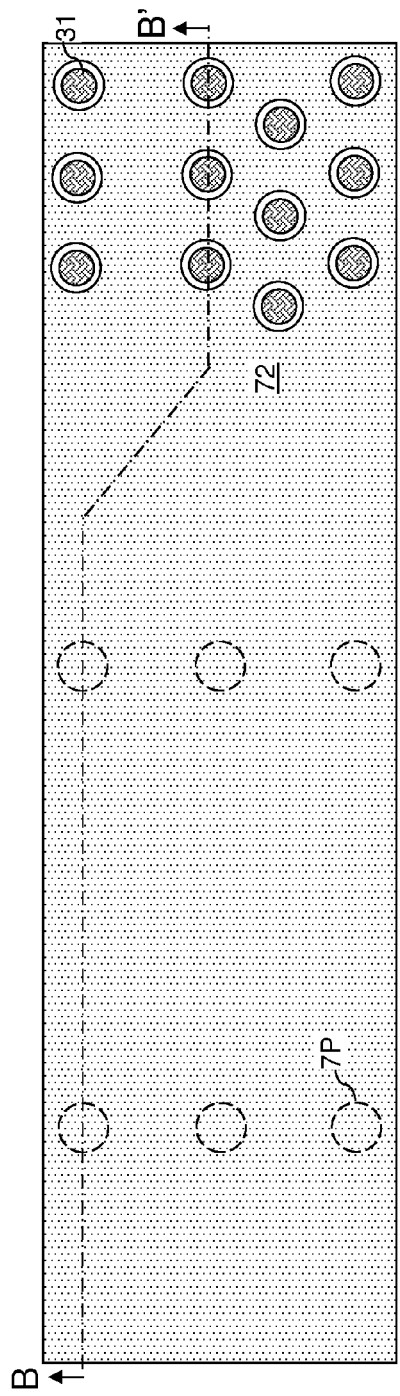
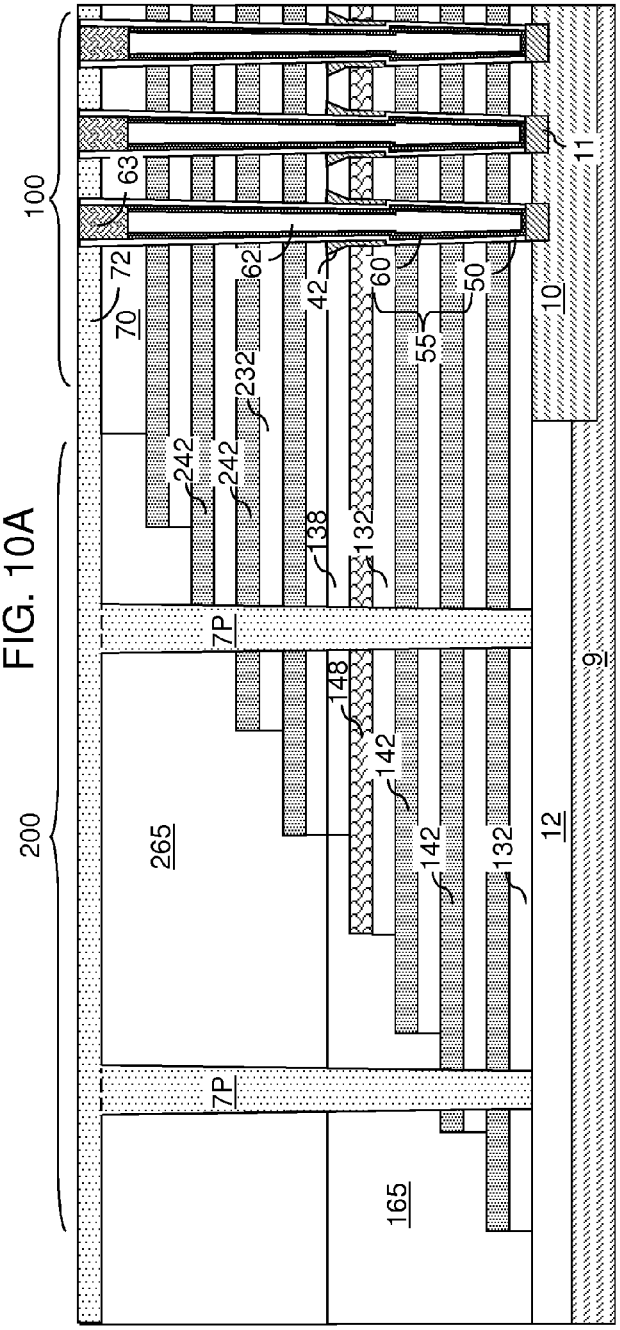
FIG. 10A
FIG. 10B

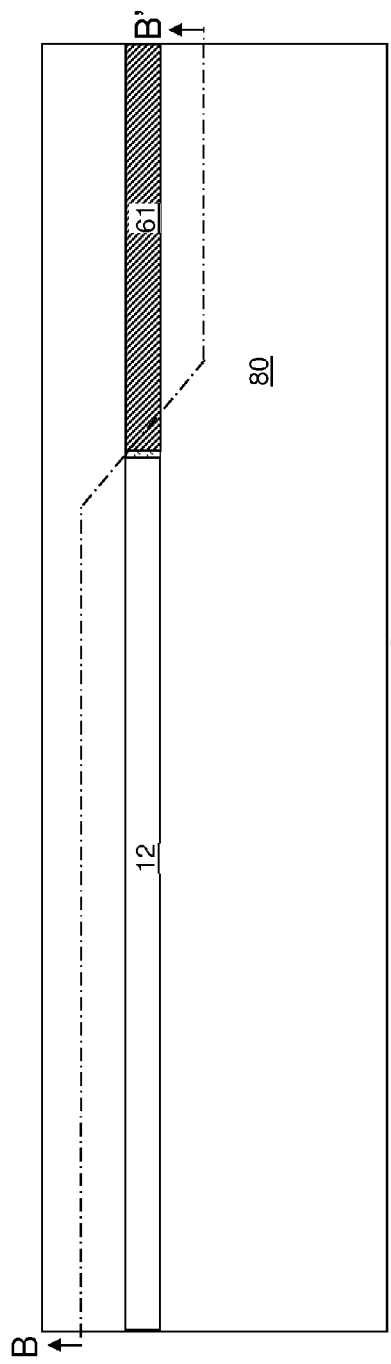
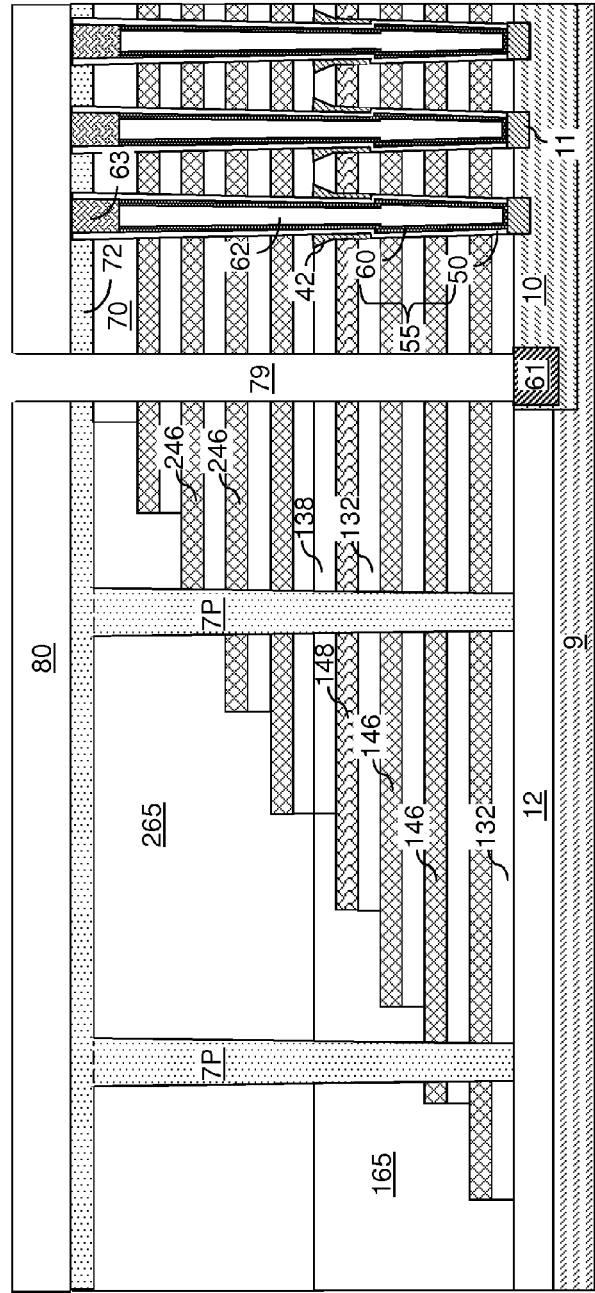
FIG. 13A
FIG. 13B

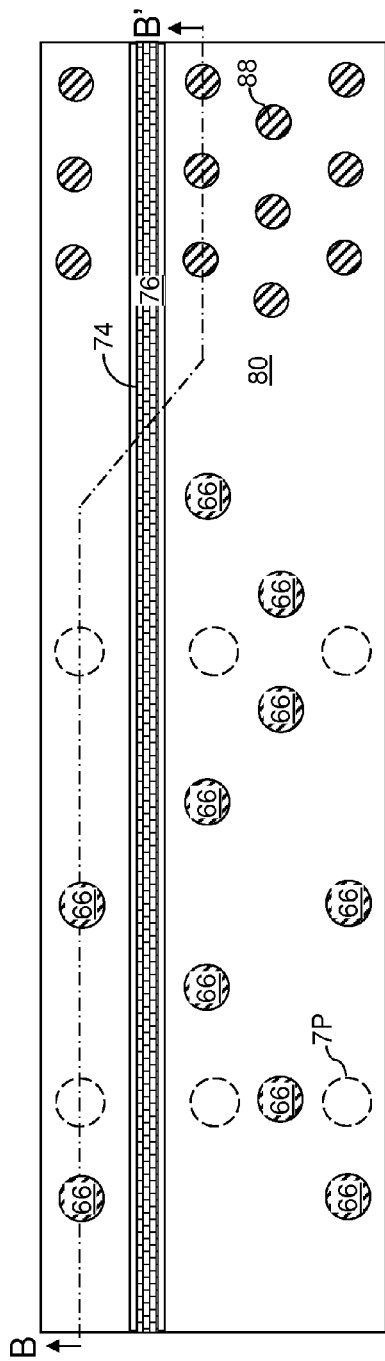
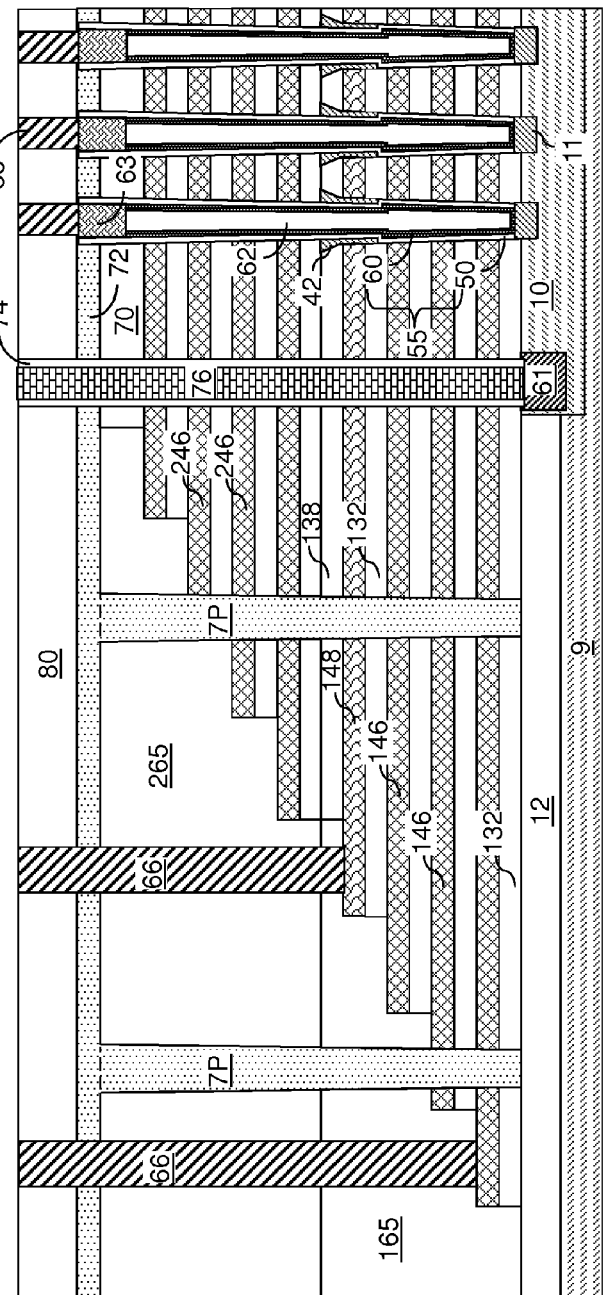
FIG. 14A
FIG. 14B

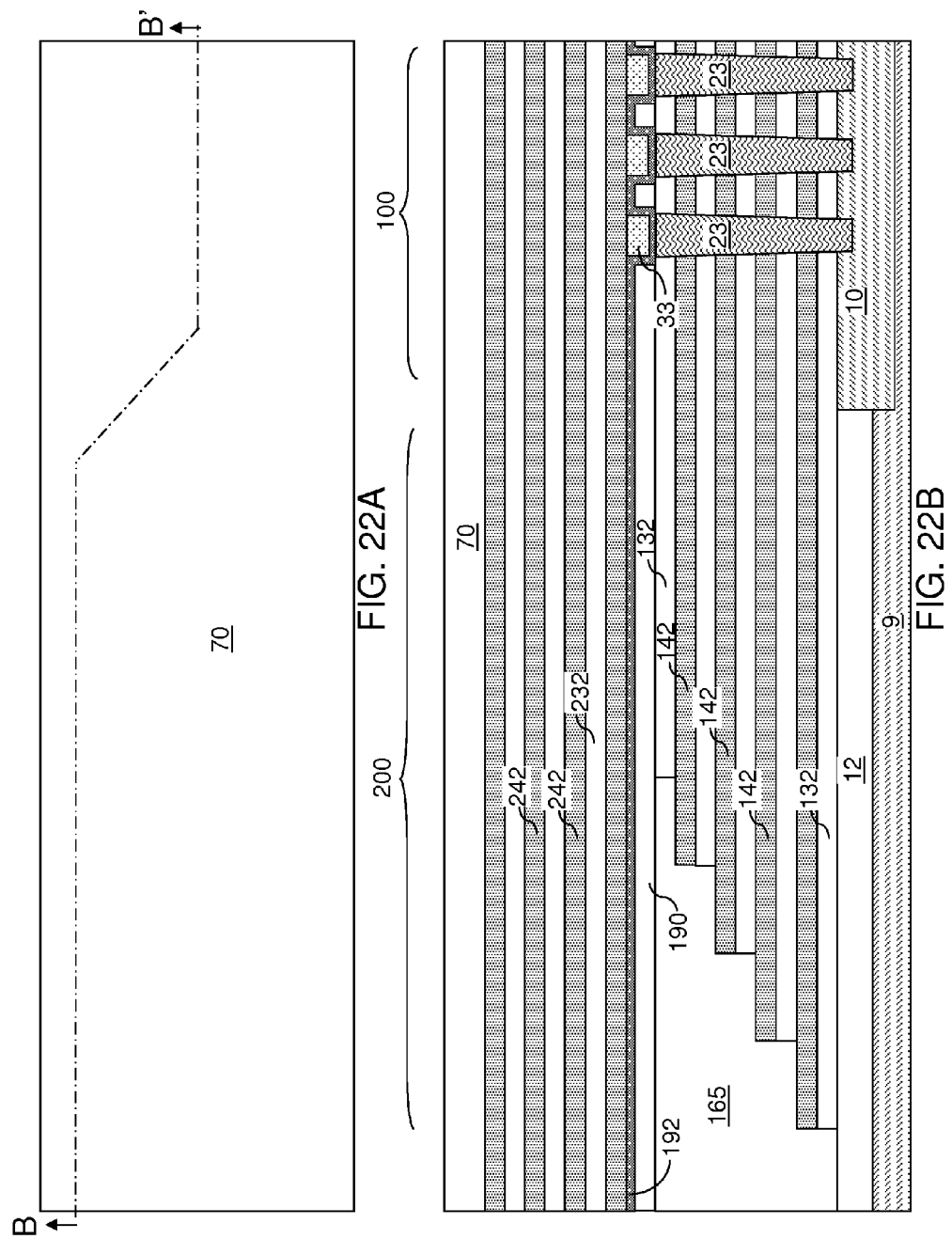

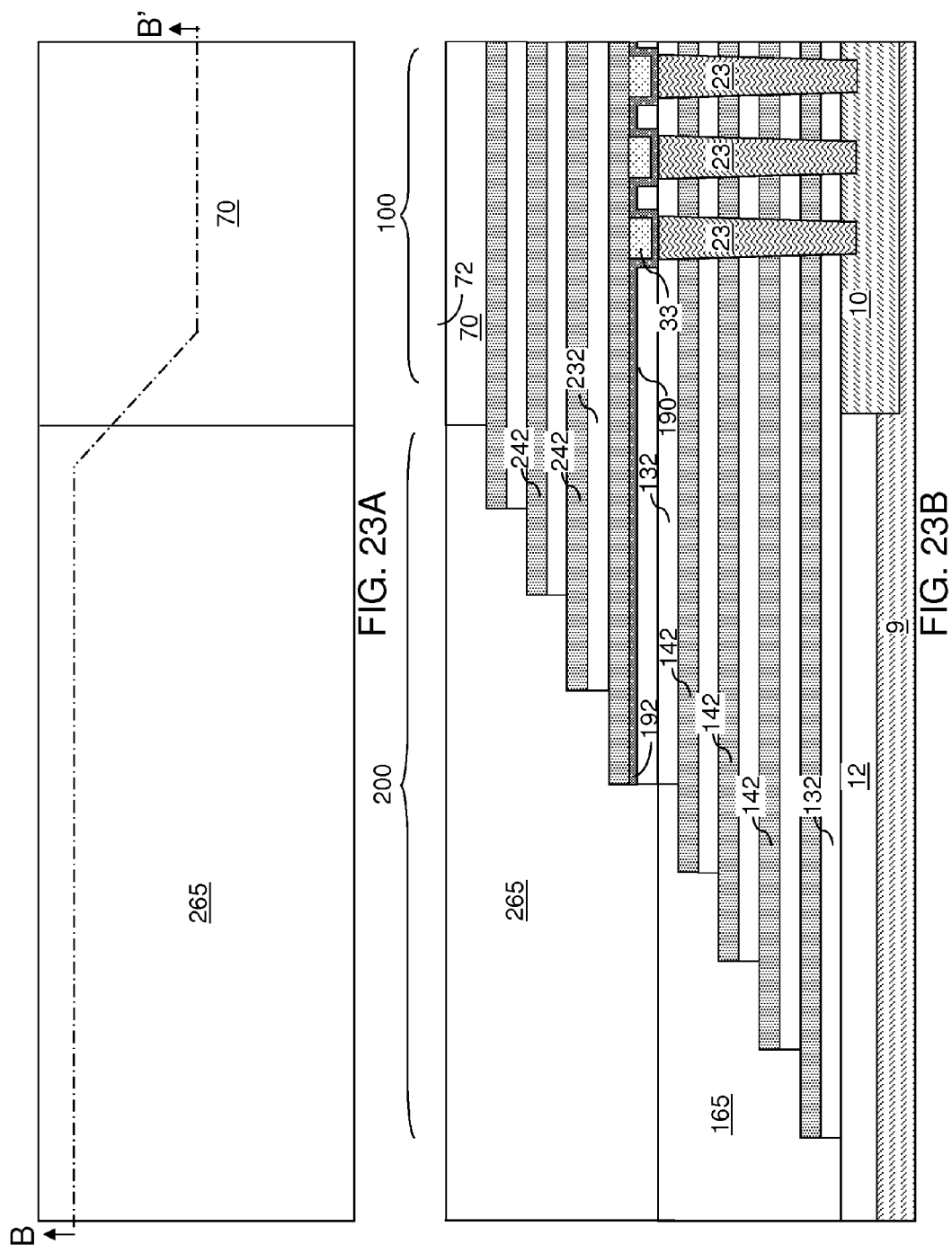

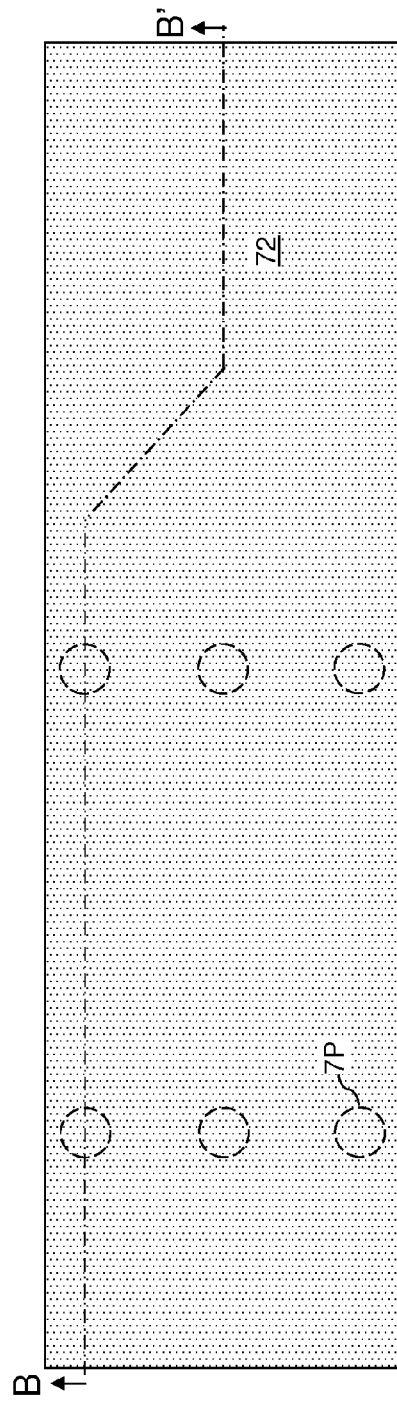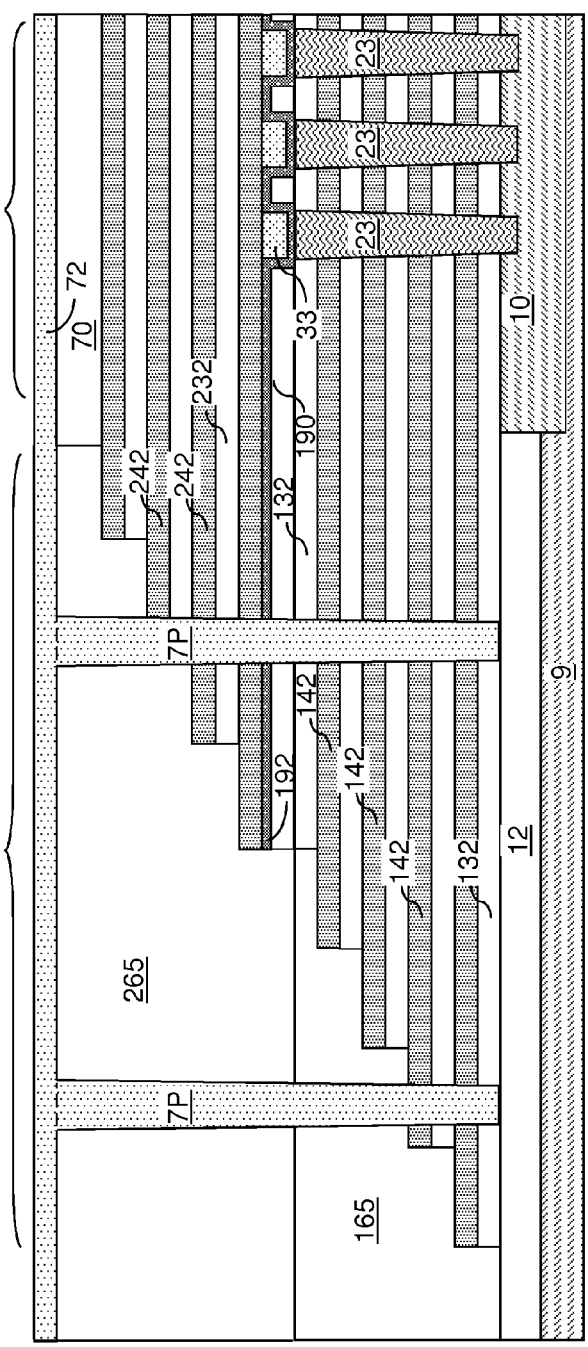

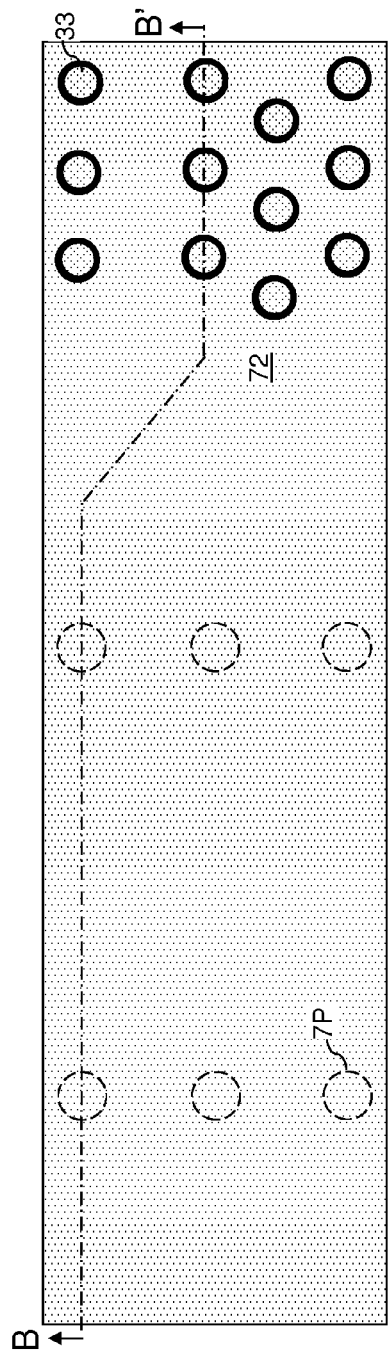
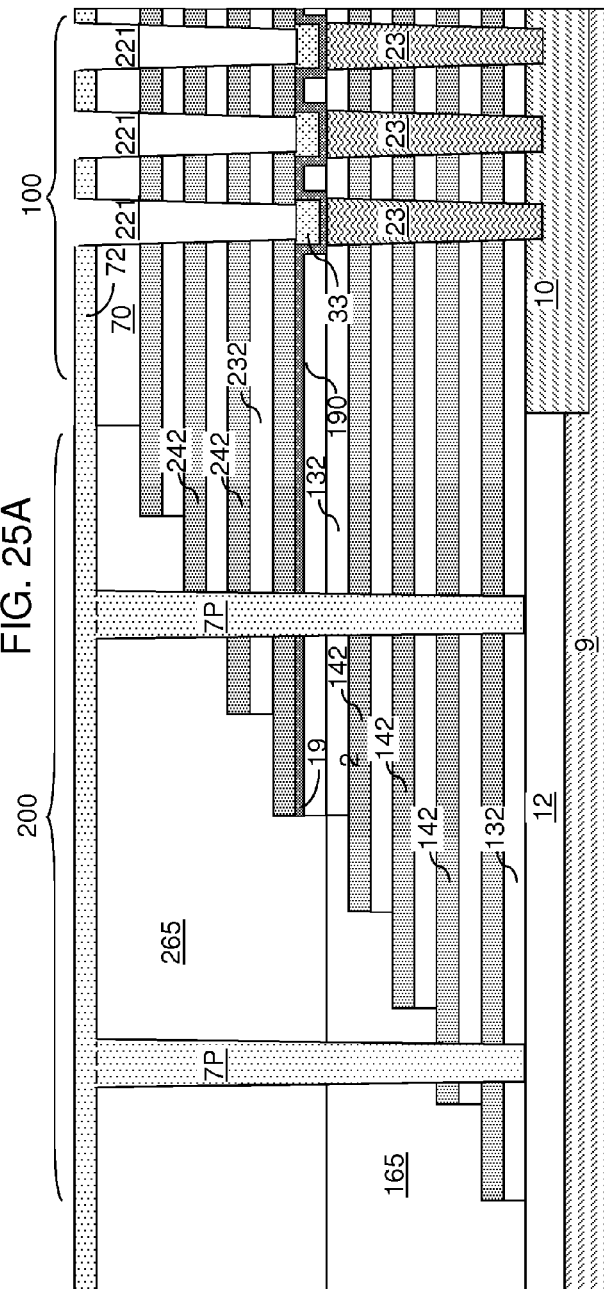
FIG. 25A
FIG. 25B

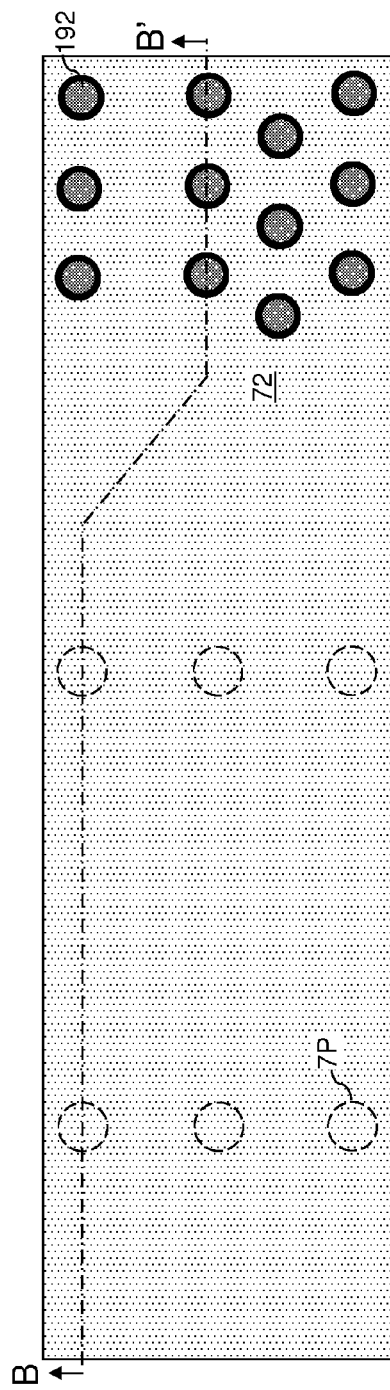
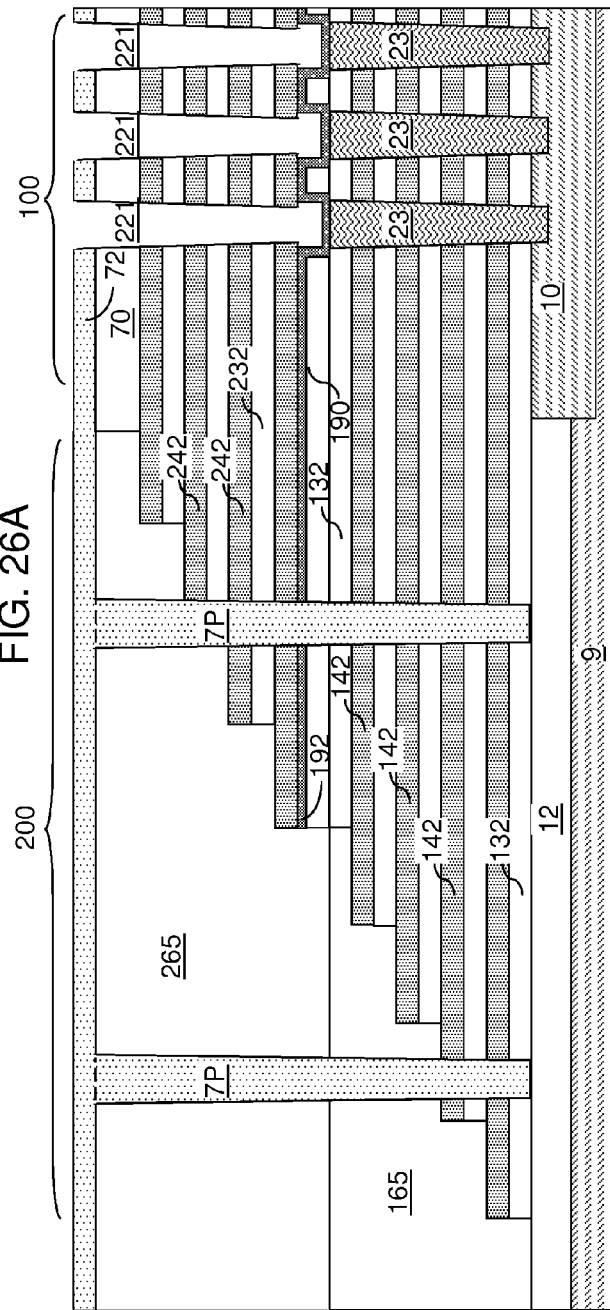
FIG. 26A
FIG. 26B

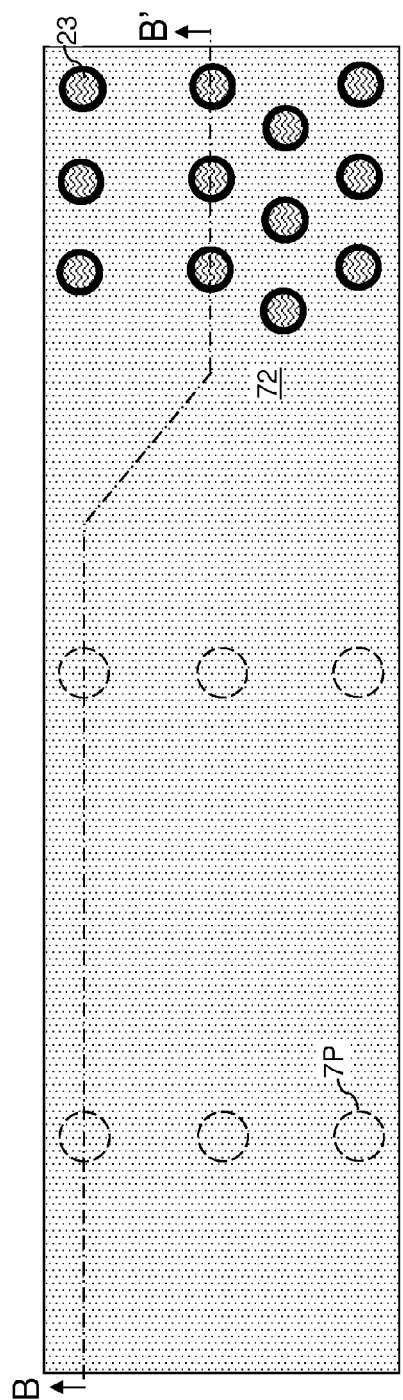
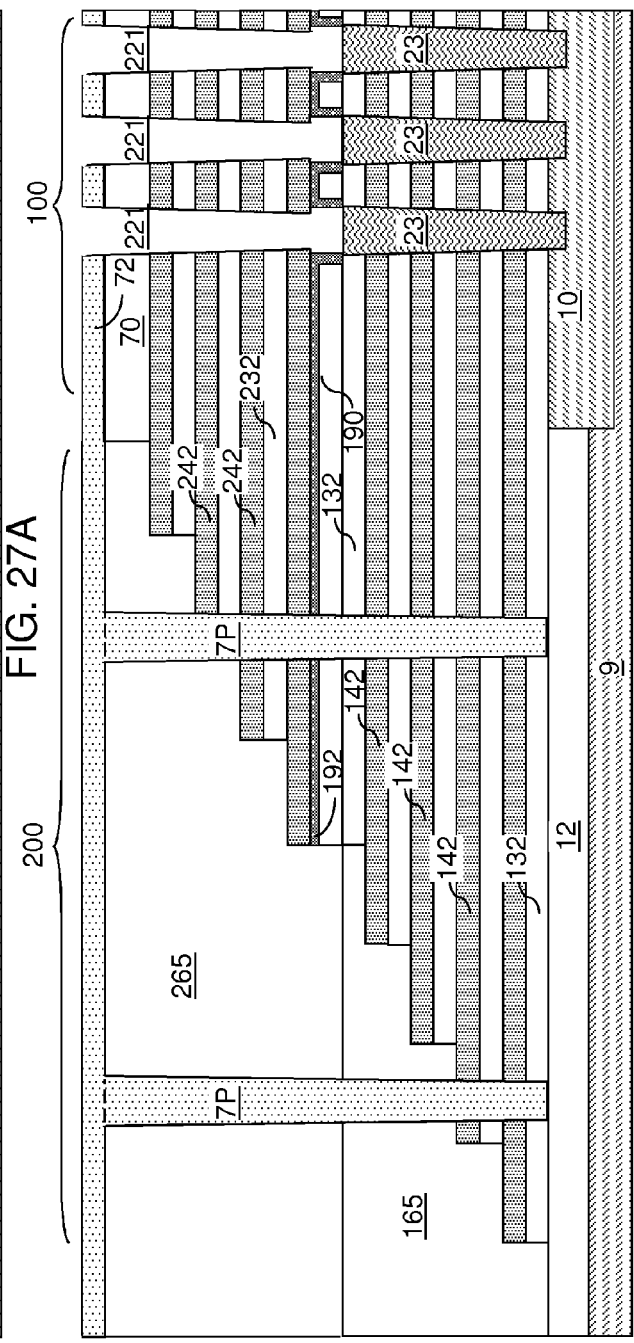
FIG. 27A
FIG. 27B

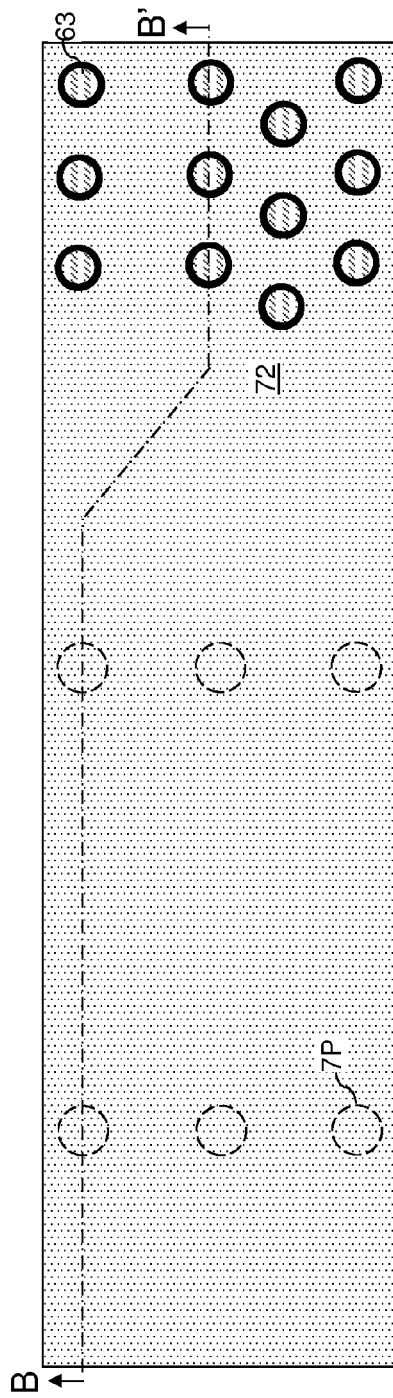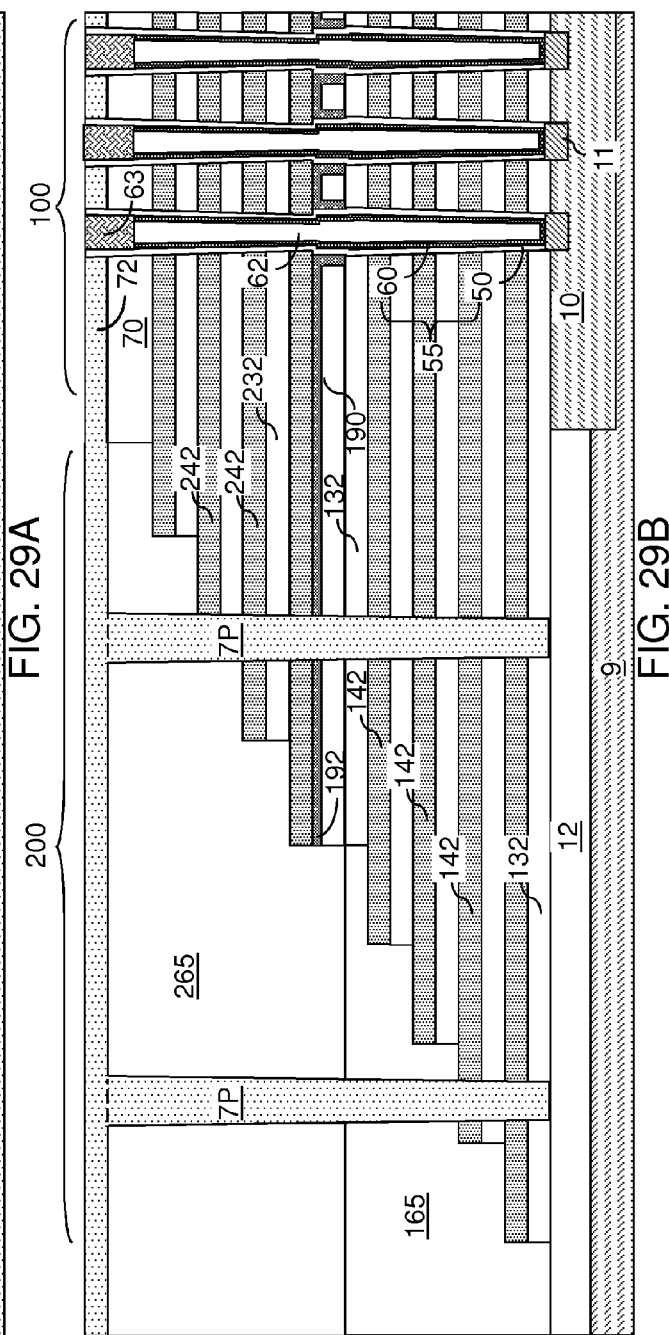
FIG. 29A
FIG. 29B

MULTILEVEL MEMORY STACK STRUCTURE WITH JOINT ELECTRODE HAVING A COLLAR PORTION AND METHODS FOR MANUFACTURING THE SAME

FIELD

The present disclosure relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which includes a lower stack structure comprising a first alternating stack including first insulating layers and first electrically conductive control gate layers located over a substrate; an upper stack structure comprising a second alternating stack including second insulating layers and second electrically conductive control gate layers located over the lower stack structure; a memory stack structure extending through the lower stack structure and the upper stack structure; and an electrode overlying the first electrically conductive layers and underlying the second electrically conductive layers, and comprising a layer portion having a thickness and a collar portion that laterally surrounds the memory stack structure and having a greater vertical extent than the thickness of the layer portion.

According to another aspect of the present disclosure, a method of forming a three-dimensional memory structure is provided. A lower stack structure comprising a first alternating stack of first insulating layers and first spacer material layers is formed over a substrate. A first memory opening is formed through the lower stack structure. A fill material structure is formed at least in an upper region of the first memory opening. An upper stack structure comprising a second alternating stack of second insulating layers and second spacer material layers is formed over the lower stack structure and the fill material structure. A second memory opening is formed through the upper stack structure in an area overlying the first memory opening. The second memory opening is extended by etching through at least a portion of the fill material structure to form an inter-stack memory opening. A memory stack structure is formed within the inter-stack memory opening. An electrode is formed, which comprises a layer portion having a thickness and a collar portion that laterally surrounds the memory stack structure and having a greater vertical extent than the thickness of the layer portion.

BRIEF DESCRIPTION OF THE DRAWINGS

FIG. 6A is a top-down view of the first exemplary structure after formation of a second alternating stack of second insulating layers and second sacrificial material layers according to the first embodiment of the present disclosure.

FIG. 6B is a vertical cross-sectional view of the first exemplary structure of FIG. 6A along the vertical plane B-B'.

FIG. 8A is a top-down view of the first exemplary structure after formation of second memory openings according to the first embodiment of the present disclosure.

FIG. 8B is a vertical cross-sectional view of the first exemplary structure of FIG. 8A along the vertical plane B-B'.

FIG. 9A is a top-down view of the first exemplary structure after formation of collar portions and inter-stack memory openings according to the first embodiment of the present disclosure.

FIG. 9B is a vertical cross-sectional view of the first exemplary structure of FIG. 9A along the vertical plane B-B'.

FIG. 10A is a top-down view of the first exemplary structure after formation of memory stack structures according to the first embodiment of the present disclosure.

FIG. 10B is a vertical cross-sectional view of the first exemplary structure of FIG. 10A along the vertical plane B-B'.

FIG. 13A is a top-down view of the first exemplary structure after formation of electrically conductive layers according to the first embodiment of the present disclosure.

FIG. 13B is a vertical cross-sectional view of the first exemplary structure of FIG. 13A along the vertical plane B-B'.

FIG. 14A is a top-down view of the first exemplary structure after formation of contact via structures according to the first embodiment of the present disclosure.

FIG. 14B is a vertical cross-sectional view of the first exemplary structure of FIG. 14A along the vertical plane B-B'.

FIG. 22A is a top-down view of the second exemplary structure after formation of a second alternating stack of second insulating layers and second sacrificial material layers according to the second embodiment of the present disclosure.

FIG. 22B is a vertical cross-sectional view of the second exemplary structure of FIG. 22A along the vertical plane B-B'.

FIG. 23A is a top-down view of the second exemplary structure after formation of second stepped surfaces and a second retro-stepped dielectric material portion according to the second embodiment of the present disclosure.

FIG. 23B is a vertical cross-sectional view of the second exemplary structure of FIG. 23A along the vertical plane B-B'.

FIG. 24A is a top-down view of the second exemplary structure after formation of dielectric pillar structures according to the second embodiment of the present disclosure.

FIG. 24B is a vertical cross-sectional view of the second exemplary structure of FIG. 24A along the vertical plane B-B'.

FIG. 25A is a top-down view of the second exemplary structure after formation of second memory openings according to the second embodiment of the present disclosure.

FIG. 25B is a vertical cross-sectional view of the second exemplary structure of FIG. 25A along the vertical plane B-B'.

FIG. 26A is a top-down view of the second exemplary structure after removal of fill material structures according to the second embodiment of the present disclosure.

FIG. 26B is a vertical cross-sectional view of the second exemplary structure of FIG. 26A along the vertical plane B-B'.

FIG. 27A is a top-down view of the second exemplary structure after removal of physically exposed horizontal portions of the sacrificial liner according to the second embodiment of the present disclosure.

FIG. 27B is a vertical cross-sectional view of the second exemplary structure of FIG. 27A along the vertical plane B-B'.

FIG. 29A is a top-down view of the second exemplary structure after formation of memory stack structures according to the second embodiment of the present disclosure.

FIG. 29B is a vertical cross-sectional view of the second exemplary structure of FIG. 29A along the vertical plane B-B'.

DETAILED DESCRIPTION

Figure 1:
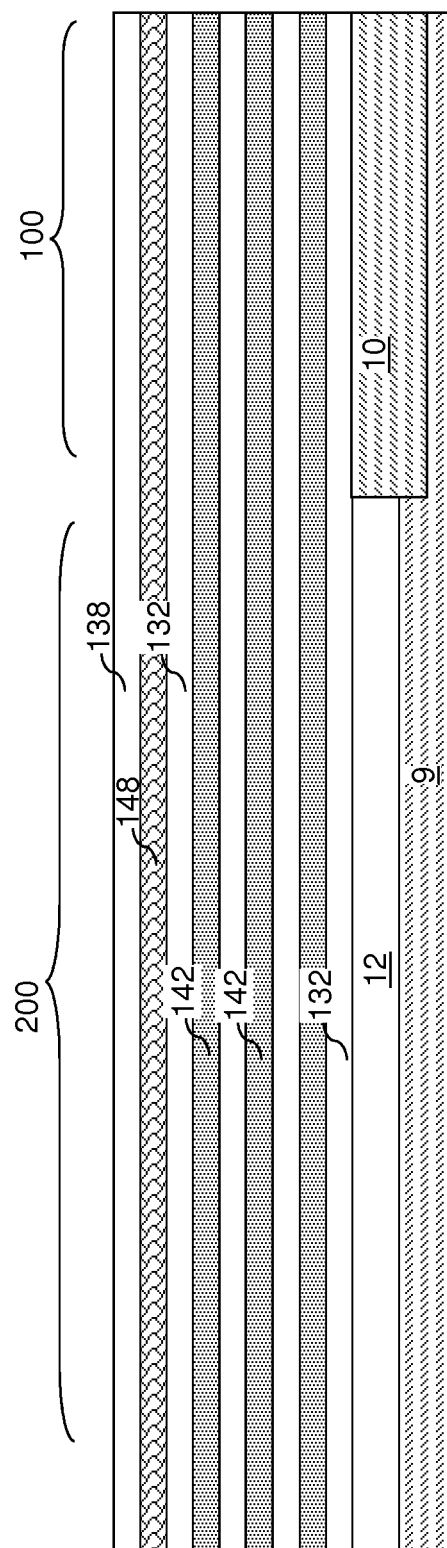
FIG. 1 is a vertical cross-sectional view of a first exemplary structure after formation of a first alternating stack of first insulating layers and first sacrificial material layers according to a first embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

The first exemplary structure includes a device region 100, in which memory devices can be subsequently formed, and a contact region 200, in which stepped surfaces are subsequently formed. As used herein, a "contact region" refers to a region in which contact via structures are to be formed. At least one semiconductor device for a peripheral circuitry can be formed in a peripheral device region, of which the general location is illustrated by a dotted rectangle (detailed structures not shown for clarity). The at least one semiconductor device can include, for example, one or more field effect transistors. The least one semiconductor device for the peripheral circuitry can contain a driver circuit for memory devices to be subsequently formed, which can include at least one NAND device.

Optionally, a semiconductor material layer 10 can be provided in an upper portion of the substrate. The semiconductor material layer 10 can be formed, for example, by implantation of electrical dopants (p-type dopants or n-type dopants) into an upper portion of the substrate semiconductor layer 9, or by deposition of a single crystalline semiconductor material, for example, by selective epitaxy. In one embodiment, the semiconductor material layer 10 can include a single crystalline semiconductor material (e.g., p-well) that is in epitaxial alignment with the single crystalline structure of the substrate semiconductor layer 9. At least one shallow trench isolation structure 12 can be formed in various portions of the substrate (9, 10) to provide electrical isolation among devices to be formed.

An alternating stack of first material layers and second material layers is subsequently formed. Each first material layer can include a first material, and each second material layer can include a second material that is different from the first material. The alternating stack is herein referred to as a first alternating stack. In one embodiment, the first alternating stack can include first insulating layers 132 and first spacer material layers. The first spacer material layers can be electrically conductive layers that do not require subsequent replacement with another material, or sacrificial material layers that require subsequent replacement with respective electrically conductive layers. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A conductive material layer 148 and a first dielectric cap layer 138 are sequentially formed. The conductive material layer 148 includes a conductive material such as a doped semiconductor material (e.g., a heavily p-type or n-type doped semiconductor material which has a p-type or n-type dopant concentration of at least $10^{18}$ cm$^3$), which can include a Group IV semiconductor material or a compound semiconductor material. In one embodiment, the conductive material layer 148 can include doped polysilicon or a doped silicon-germanium alloy. In one embodiment, the conductive material layer 148 can be a doped semiconductor layer. The thickness of the conductive material layer 148 can be in a range from 20 nm to 50 nm, although lesser and greater thicknesses can also be employed. The first dielectric cap layer 138 includes a dielectric material, which can be any dielectric material that can be employed for the first insulating layers 132. In one embodiment, the first dielectric cap layer 138 includes the same dielectric material as the first insulating layers 132. The thickness of the conductive material layer 148 can be in a range from 20 nm to 200 nm, although lesser and greater thicknesses can also be employed. The first alternating stack (132, 142), the conductive material layer 148, and the first dielectric cap layer 138 collectively constitute a lower stack structure (132, 142, 138, 148).

Figure 2A:
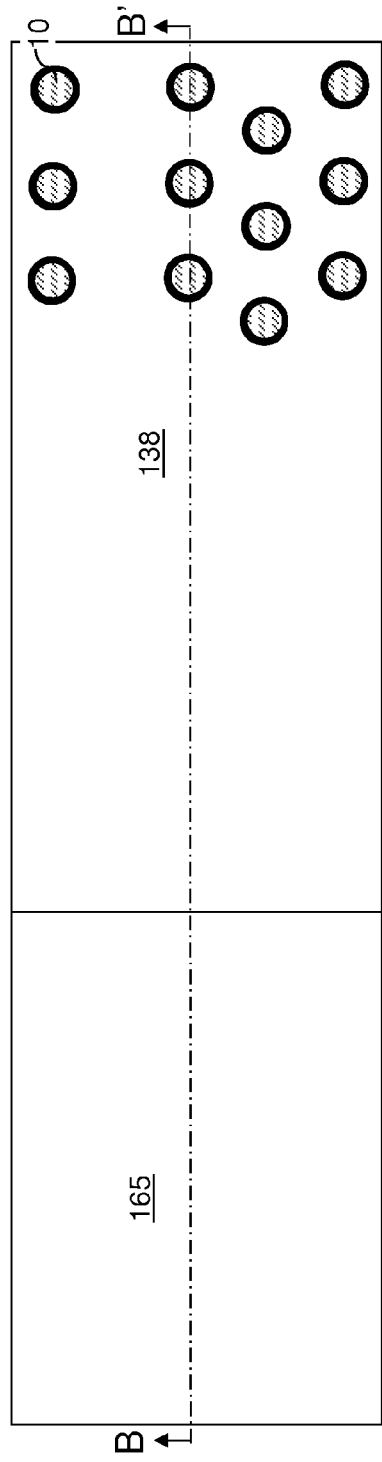
FIG. 2A is a vertical cross-sectional view of the first exemplary structure after formation of first stepped surfaces, a first retro-stepped dielectric material portion, and first memory openings according to the first embodiment of the present disclosure.
Figure 2B:
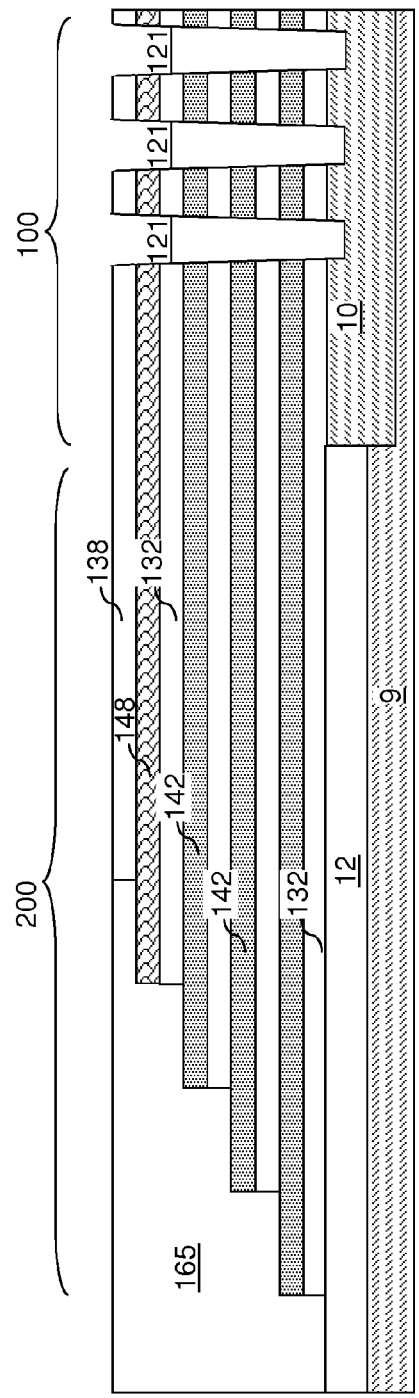
FIG. 2B is a vertical cross-sectional view of the first exemplary structure of FIG. 2A along the vertical plane B-B'.

Referring to FIGS. 2A and 2B, the lower stack structure (132, 142, 138, 148) can be patterned to form first stepped surfaces. The first stepped surfaces are formed in the contact region 200. The contact region 200 includes a first stepped area in which the first stepped surfaces are formed, and a second stepped area in which additional stepped surfaces are to be subsequently formed in an upper stack structure (to be subsequently formed over the lower stack structure). The device region 100 is provided adjacent to the contact region 200. Memory devices including memory stack structures can be subsequently formed in the device region 100. The first stepped surfaces can be formed, for example, by forming a mask layer with an opening therein, etching a cavity within the levels of the first dielectric cap layer 138 and the conductive material layer 148, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first retro-stepped dielectric material portion 165, which is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The lower stack structure, which is also referred to as a first stack structure, comprises the first alternating stack (132, 142) and the first retro-stepped dielectric material portion 165.

First memory openings 121 extending to a top surface of the substrate (9, 10) are formed through the lower stack structure (132, 142, 138, 148, 165). The first memory openings 121 can be formed in the device region 100. For example, a lithographic material stack (not shown) including at least a photoresist layer can be formed over the lower stack structure (132, 142, 138, 148, 165), and can be lithographically patterned to form openings within the lithographic material stack. The pattern in the lithographic material stack can be transferred through the entirety of the lower stack structure (132, 142, 138, 148, 165) by at least one anisotropic etch that employs the patterned lithographic material stack as an etch mask. Portions of the lower stack structure (132, 142, 138, 148, 165) underlying the openings in the patterned lithographic material stack are etched to form the first memory openings 121. In other words, the transfer of the pattern in the patterned lithographic material stack through the lower stack structure (132, 142, 138, 148, 165) forms the first memory openings 121.

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first memory openings 121 can be substantially vertical, or can be tapered. Subsequently, the patterned lithographic material stack can be subsequently removed, for example, by ashing.

In one embodiment, the substrate (9, 10) can be employed as a stopping layer for the anisotropic etch process. In one embodiment, the first memory openings 121 may extend below the top surface of the substrate (9, 10) by an overetch. The lateral dimensions (e.g., a diameter) of the first memory openings 121 can be from about 20 nm to 200 nm at an upper portion of each first memory opening 121, and can be about 10 nm to 150 nm at a lower portion of each first memory opening 121. In one embodiment, the first memory openings 121 can be formed as an array of openings, which can be a periodic two-dimensional array of openings.

The remaining portion of the conductive material layer 148 constitutes a layer portion of a joint region electrode, which refers to an electrode located in a joint region. As used herein, a joint region is a region in which a first stack structure and a second stack structures are adjoined to each other in a multi-stack structure, i.e., a structure formed by adjoining multiple stack structures. As used herein, a layer portion refers to a portion of a structure that has a general shape of a layer having a uniform thickness throughout.

Figure 3A:
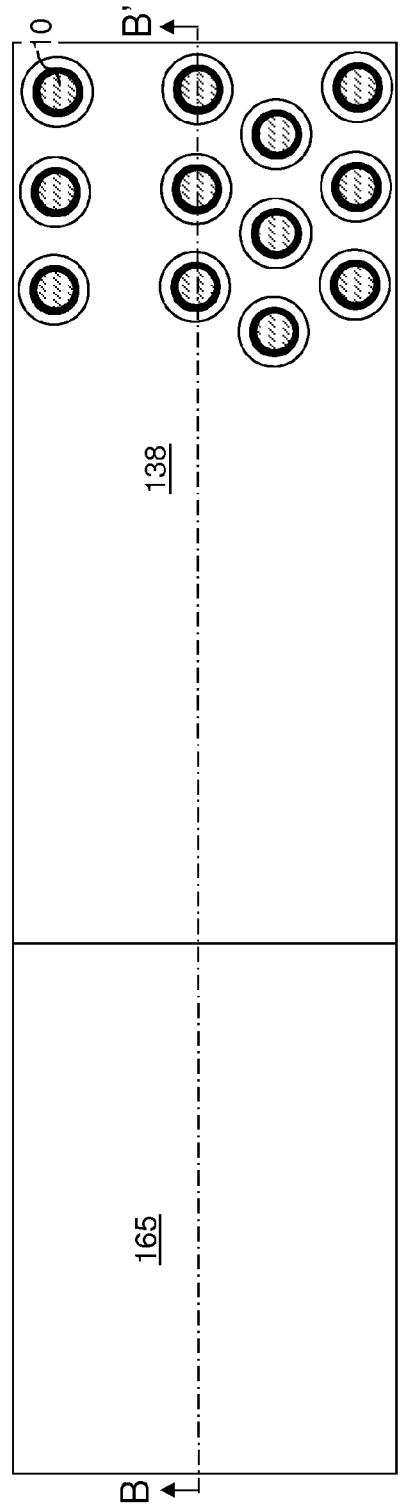
FIG. 3A is a top-down view of the first exemplary structure after formation tapered sidewalls in an upper region of each first memory opening according to the first embodiment of the present disclosure.
Figure 3B:
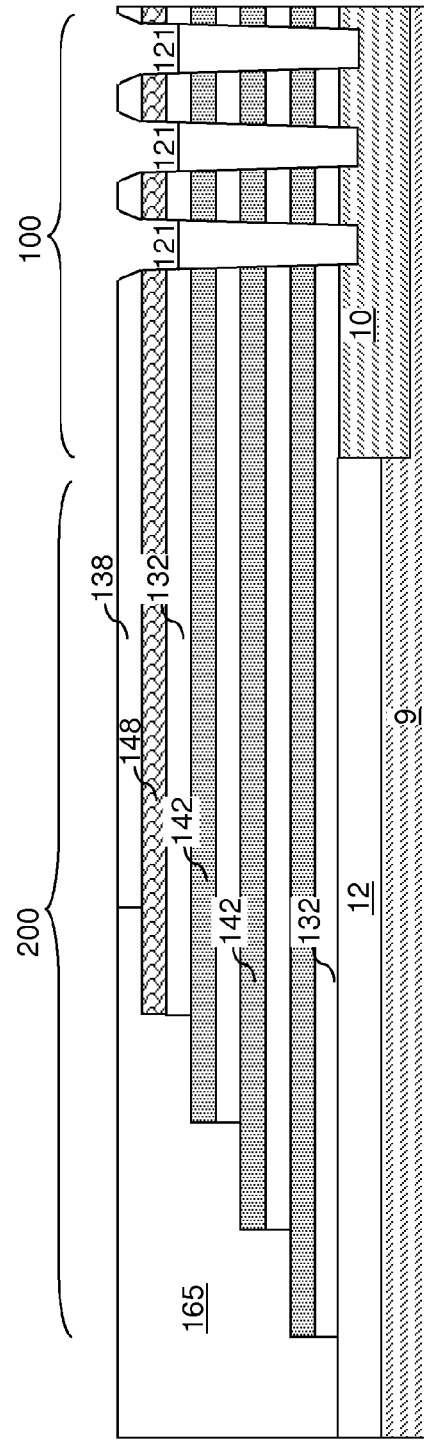
FIG. 3B is a vertical cross-sectional view of the first exemplary structure of FIG. 3A along the vertical plane B-B'.

Referring to FIGS. 3A and 3B, in one embodiment, tapered sidewalls can be formed on the first dielectric cap layer 138 around each first memory opening 121. The tapered sidewalls of the first dielectric cap layer 138 can be formed, for example, by increasing an isotropic etch component of the anisotropic etch process at, or near, the end of the anisotropic etch that forms the first memory openings 121, for example, by altering the ratio of gas mixture of the anisotropic etch process. The taper angle of the sidewalls of the first dielectric cap layer 138, as measured from a vertical line that is perpendicular to the top surface of the substrate (9, 10) can be in a range from 3 degrees to 45 degrees (such as from 6 degrees to 30 degrees), although lesser and greater angles can also be employed. If provided, the tapered sidewalls of the first dielectric cap layer 138 can be employed to provide a greater overlay tolerance between alignment of the first memory openings 121 and second memory openings in an upper stack structure to be subsequently formed.

Figure 4A:
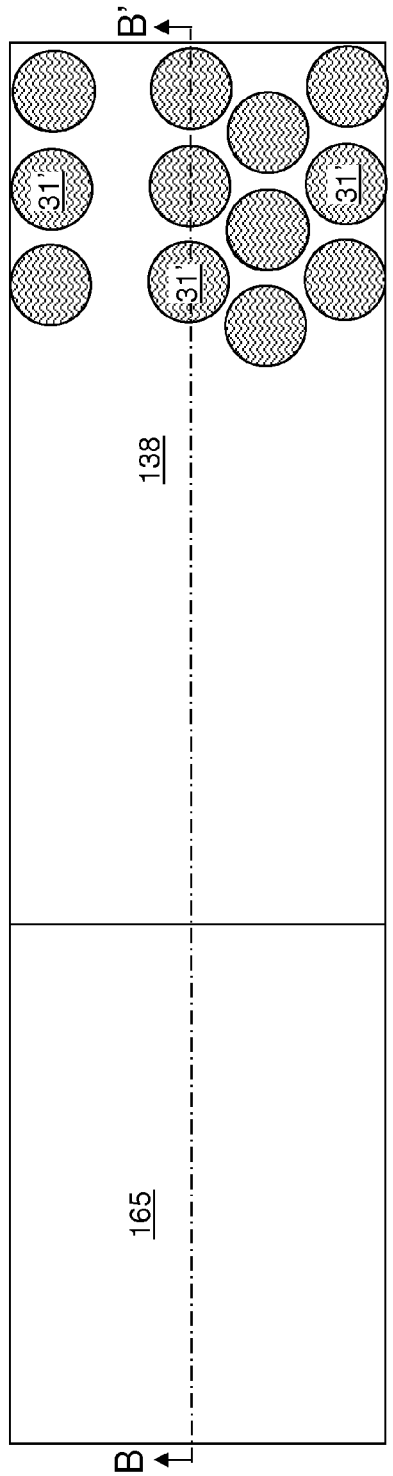
FIG. 4A is a top-down view of the first exemplary structure after formation of epitaxial channel portions at a bottom of each first memory opening and in-process fill material structures at an upper portion of each first memory opening according to the first embodiment of the present disclosure.
Figure 4B:
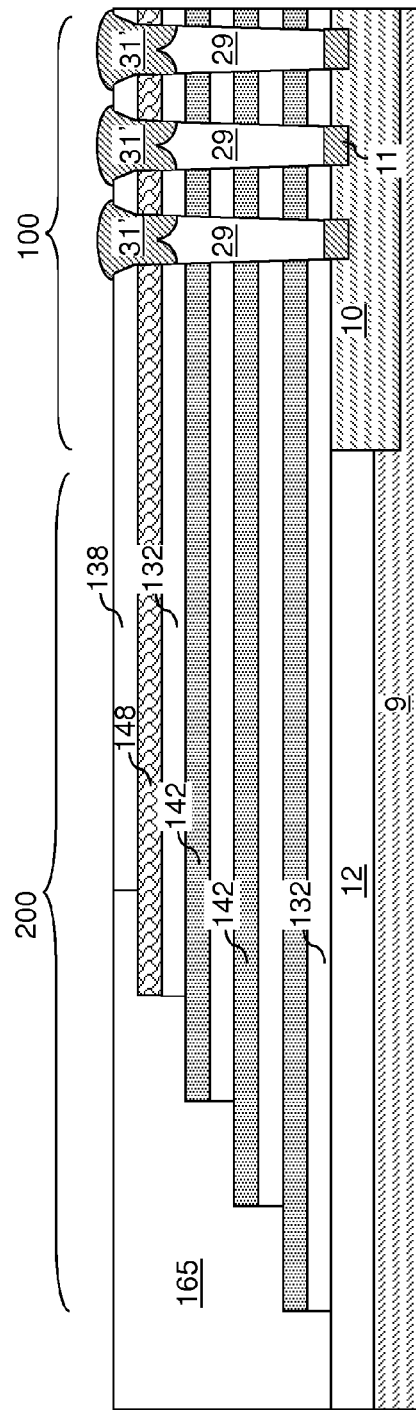
FIG. 4B is a vertical cross-sectional view of the first exemplary structure of FIG. 4A along the vertical plane B-B'.

Referring to FIGS. 4A and 4B, a selective epitaxy process is performed to deposit a semiconductor material on physically exposed semiconductor surfaces. In one embodiment, the conductive material layer 148 can include a doped semiconductor material and a semiconductor surface can be physically exposed at the bottom of each first memory opening 121. In this case, in-process fill material structures 31' and epitaxial channel portions 11 can be simultaneously deposited by selective epitaxy of a semiconductor material. As used herein, an "in-process" structure refers to a structure that is subsequently modified or removed in a subsequent processing step.

Specifically, epitaxial channel portions 11 grow from the semiconductor surfaces at the bottom of the first memory openings 121 during the selective epitaxy process. Concurrently with the growth of the epitaxial channel portions 11, the in-process fill material structures 31' grow from the physically exposed semiconductor surfaces of the conductive material layer 148 during the selective epitaxy process. As the in-process fill material structures 31' grow in size, the in-process fill material structures pinches off the top portion of each first memory opening 121. Upon pinching off of the upper portion of each first memory opening 121, the growth of the epitaxial channel portions 11 terminates. The in-process fill material portions 31' may continue to grow after the pinch off of the top portion of each first memory opening 121. The doped semiconductor material of the in-process fill material portions 31' is formed on the sidewalls of the conductive material layer 148, which is a layer portion of a joint region electrode to be subsequently completed.

The in-process fill material structures 31' can be formed as polycrystalline semiconductor material portions, single crystalline semiconductor material portions, or a combination thereof depending on the crystallinity of the conductive material layer 148 and process conditions of the selective semiconductor material deposition process. In one embodiment, an anneal process may be employed to increase the average size of grains in the conductive material layer 148. In one embodiment, a predominant grain within the in-process fill structure 31' may grow at a faster rate than other grains such that a predominant portion of an in-process fill material structure 31' can be single crystalline. The in-process fill material structures 31' may grow isotropically, or may grow with random facets or facets of preferred orientations. The top surfaces of the in-process fill material structures 31' can protrude above a horizontal plane including the top surface of the first dielectric cap layer 138. In one embodiment, the top surfaces of the in-process fill material structures 31' can be convex at the end of the selective deposition process.

The epitaxial channel portions 11 comprise a single crystalline semiconductor material in epitaxial alignment with the single crystalline substrate semiconductor material of the semiconductor material layer 10. The composition of the epitaxial channel portions 11 can be the same as the composition of the in-process fill material structures 31'.

In one embodiment, the deposited semiconductor material may be doped with in-situ doping of a p-type dopant or an n-type dopant. Thus, the in-process fill material structures 31' and the epitaxial channel portions 11 can be doped with electrical dopants of a suitable conductivity type. In one embodiment, the in-process fill material structures 31', the semiconductor material layer 10, and the epitaxial channel portions 11 can have a doping of the first conductivity type (e.g., p-type). The in-process fill material structures 31' and the epitaxial channel portions 11 may both comprise silicon. For example, the in-process fill material structures 31' may comprise p-type doped large grain polysilicon or single crystal silicon and the epitaxial channel portions 11 may comprise p-type doped single crystal silicon.

The selective epitaxy process that forms the in-process fill material structures 31' and the epitaxial channel portions 11 can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the semiconductor material layer 10) is greater than the etch rate of the semiconductor material by the etchant. Thus, the semiconductor material is deposited only on the semiconductor surface, which is the physically exposed portion of the top surface of the semiconductor material layer 10. The process conditions (such as the deposition temperature, the partial pressure of the various gases in a process chamber, etc.) can be selected such that the deposited semiconductor material is epitaxial, i.e., single crystalline silicon or another semiconductor material with atomic alignment with the single crystalline structure of the semiconductor material layer 10 (e.g., p-well).

Figure 5A:
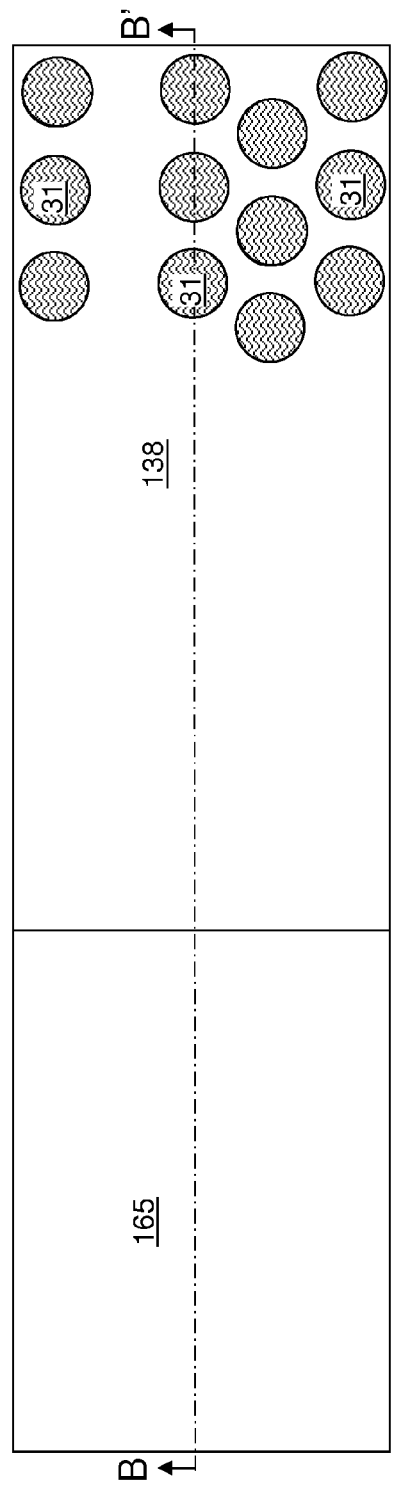
FIG. 5A is a top-down view of the first exemplary structure after formation of fill material structures by a planarization process according to the first embodiment of the present disclosure.
Figure 5B:
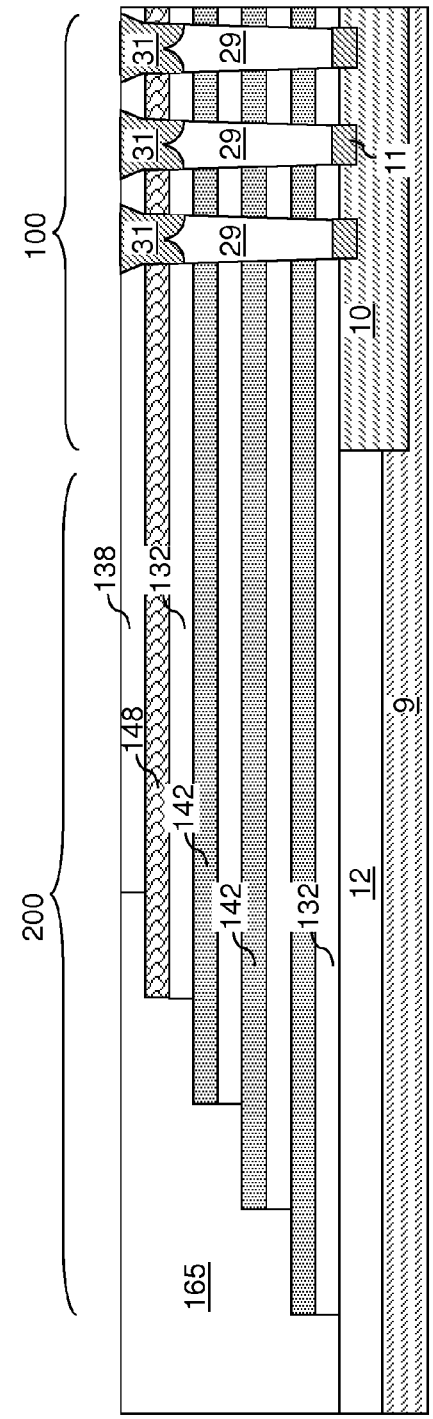
FIG. 5B is a vertical cross-sectional view of the first exemplary structure of FIG. 5A along the vertical plane B-B'.

Referring to FIGS. 5A and 5B, a portion of the deposited doped semiconductor material can be removed from above the horizontal plane of the first dielectric cap layer 138 (which is a dielectric material layer overlying the conductive material layer 148, which is the layer portion of the joint region electrode to be subsequently completed). Each remaining portion of the deposited doped semiconductor material (i.e., the in-process fill material structure 31') in the first memory openings 121 constitutes a fill material structure 31. In one embodiment, a planarization process is performed to remove portions of the in-process fill material structures 31' from above the horizontal plane including a topmost layer of the lower stack structure (132, 142, 138, 148, 165), which may be the first dielectric cap layer 138. In one embodiment, a chemical mechanical planarization (CMP) process can be employed to remove the in-process fill material structures 31' from above the first dielectric cap layer 138. The top surface of each fill material structure 31 can be coplanar with the top surface of the first dielectric cap layer 138. An encapsulated cavity 28 is formed within a portion of each first memory opening 121 that underlies a respective fill material structure 31. As used here, a "cavity" refers to a volume that does not include a solid or a liquid material. A cavity may be under vacuum or may include a gas phase material. As used herein, an "encapsulated cavity" refers to a cavity that is encapsulated, i.e., a cavity that is inside a continuous set of surfaces that do not have any opening therein. Thus, surfaces that define an encapsulated cavity are continuous and contiguous among one another, and do not include any gap thereamongst. In one embodiment, each fill material structure 31 can have a non-planar bottom surface and a planar top surface.

Referring to FIGS. 6A and 6B, a second alternating stack (232, 242) of material layers is subsequently formed on the top surface of the lower stack structure (132, 142, 138, 148, 165). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second dielectric cap layer 70 can be subsequently formed over the second stack (232, 242). The dielectric cap layer 70 includes a dielectric material that is different from the material of the second sacrificial material layers 242. In one embodiment, the dielectric cap layer 70 can include silicon oxide.

Figure 7A:
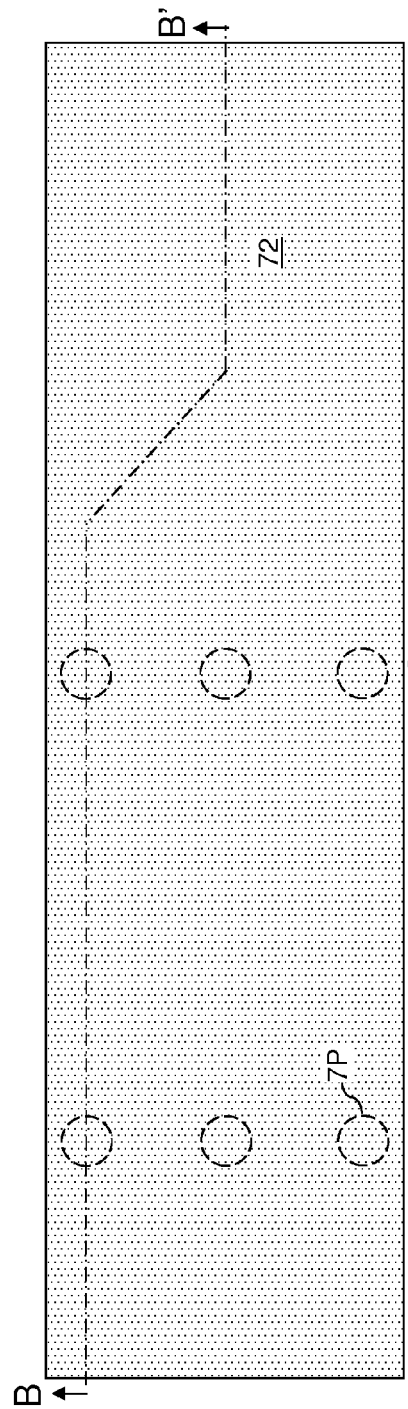
FIG. 7A is a top-down view of the first exemplary structure after formation of second stepped surfaces, a second retro-stepped dielectric material portion, and dielectric pillar structures according to the first embodiment of the present disclosure.
Figure 7B:
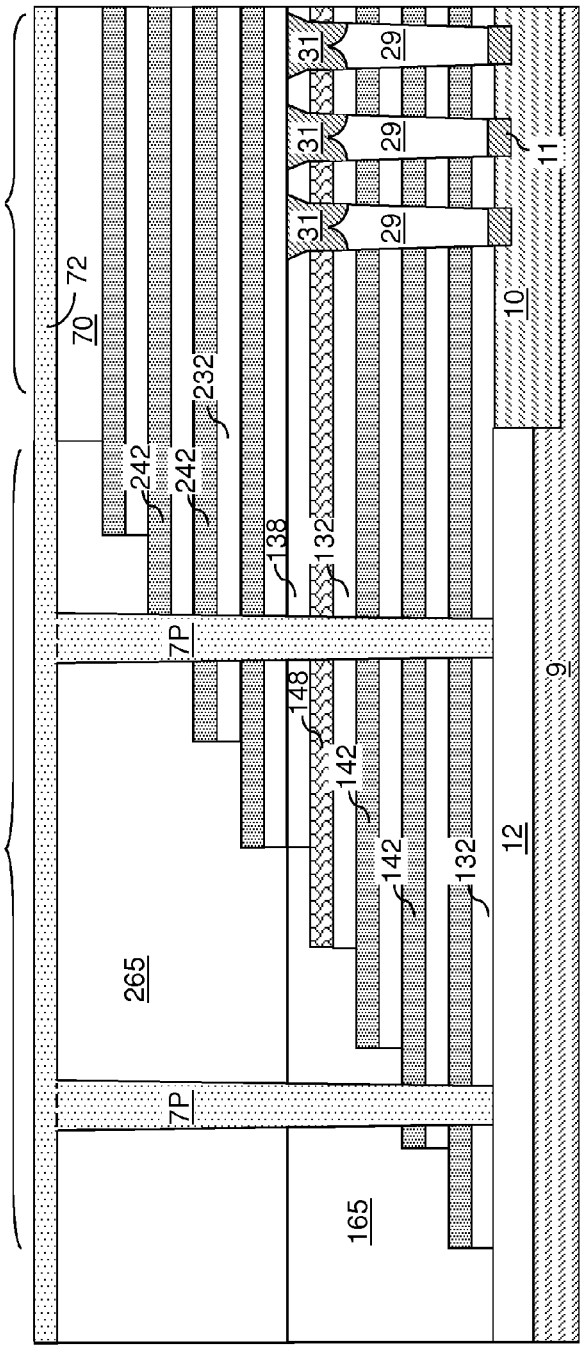
FIG. 7B is a vertical cross-sectional view of the first exemplary structure of FIG. 7A along the vertical plane B-B'.

Referring to FIGS. 7A and 7B, additional stepped surfaces are formed in the second stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the lower stack structure (132, 142, 138, 148, 165). The second stepped surfaces can be adjacent to, and do not overlie, the stepped interface between the first alternating stack (132, 146) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second stack (232, 242) and a contact area for the first alternating stack (132, 142).

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the first retro-stepped first dielectric material portion 165, from which all layers of the second stack (232, 242) are removed. The area of the second stepped cavity further includes the area of the second stepped surfaces of the second stack (232, 242).

Dielectric material is deposited to fill the second stepped cavity. Excess portions of the dielectric material overlying the topmost surface of the second stack (232, 242) are removed, for example, by chemical mechanical planarization. The remaining portion of the deposited dielectric material is retro-stepped, and thus, forms a second retro-stepped dielectric material portion 265. The second retro-stepped dielectric material portion 265 is located on, and over, the second stepped surfaces of the second stack (232, 242). The second retro-stepped dielectric material portion 265 is formed on the second stepped surfaces. The contact region 200 comprises a region of the first stepped surfaces and a region of the second stepped surfaces.

Support pillar structures 7P and an optional planarization dielectric layer 72 can be formed over the second dielectric cap layer 70. For example, via trenches can be formed through the upper stack structure (232, 242, 265, 70) and the lower stack structure (132, 142, 138, 148, 165) in areas in which formation of the support pillar structures 7P is desired, for example, by application and patterning of a photoresist layer and transfer of the pattern in the photoresist layer by an anisotropic etch. After removal of the photoresist layer (for example, by ashing), one or more dielectric materials can be deposited in the via trenches and over the upper stack structure (232, 242, 265, 70). The portions of the deposited dielectric material(s) in the via trenches constitute the support pillar structures 7P, and the portion of the deposited dielectric material(s) over the upper stack structure (232, 242, 265, 70) constitute the planarization dielectric layer 72. Optionally, the portion of the deposited dielectric material(s) over the upper stack structure (232, 242, 265, 70) may be removed by a recess etch or chemical mechanical planarization.

Referring to FIGS. 8A and 8B, second memory openings 221 are formed through the upper stack structure (232, 242, 265, 70, 72) to the top surface of the lower stack structure (132, 142, 138, 148, 165). The second memory openings 221 are formed in areas that overlie the first memory openings 121, i.e., in areas that substantially coincides with the areas of the first memory openings 121.

For example, a lithographic material stack (not shown) including at least a photoresist layer can be formed over the upper stack structure (232, 242, 265, 70, 72), and can be lithographically patterned to form openings within the lithographic material stack. The pattern in the lithographic material stack can be transferred through the entirety of the upper stack structure (232, 242, 265, 70, 72) by at least one anisotropic etch that employs the patterned lithographic material stack as an etch mask. Portions of the upper stack structure (232, 242, 265, 70, 72) underlying the openings in the patterned lithographic material stack are etched to form the second memory openings (221, 421). In other words, the transfer of the pattern in the patterned lithographic material stack through the upper stack structure (232, 242, 265, 70, 72) forms the second memory openings (221, 421).

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second memory openings 221 can be substantially vertical, or can be tapered. In one embodiment, the fill material structures 31 may be employed as stopping structures for the anisotropic etch process that forms the second memory openings 221.

Referring to FIGS. 9A and 9B, the second memory openings 221 can be vertically extended by continuing the anisotropic etch process with a change in etch chemistry for etching the material of the fill material structures 31. Each second memory opening 221 can be extended through a central portion of an underlying fill material structure 31. A central portion of each fill material structure 31 can be anisotropically etched. Each second memory opening 121 can be connected to an underlying encapsulated cavity 29 as the center portions of the fill material structures 31 are etched through during the anisotropic etch process to form an inter-stack memory opening 49, which extends across the upper and lower stack structures.

Each remaining portion of the fill material structure 31 constitutes a collar portion 42. The collar portions 42 and the conductive material layer 148 collectively constitutes an electrode formed in a joint region between the upper stack structure (232, 242, 70, 265) and the lower stack structure (132, 142, 138, 148, 165), which is herein referred to as a joint region electrode (148, 42). The joint region electrode (148, 42) includes the conductive material layer 148, which is a layer portion having a uniform thickness, and a collar portion 42 that laterally surrounds the inter-stack memory opening 49 and having a greater vertical extent than the uniform thickness of the layer portion. In one embodiment, each collar portion 42 can comprise a remaining annular portion of the fill material structure 31 that remains after extending the second memory opening 221 to form the inter-stack memory opening 49. Subsequently, the patterned lithographic material stack can be subsequently removed, for example, by ashing.

Figure 10C:
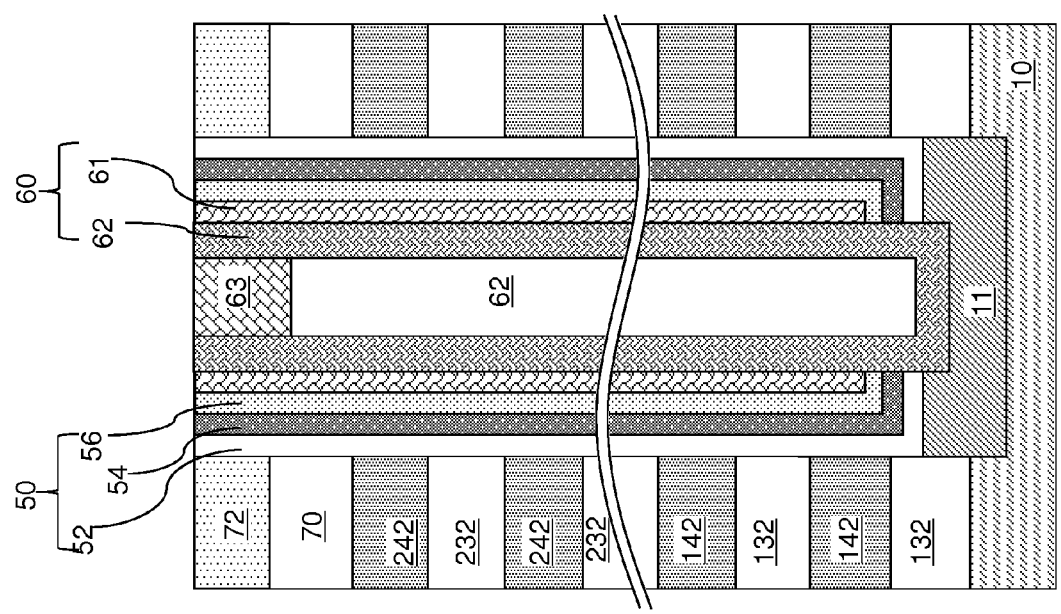
FIG. 10C is a vertical cross-sectional view of a memory stack structure within the first exemplary structure of FIGS. 10A and 10B.

Referring to FIGS. 10A-10C, a blocking dielectric layer 52, a memory material layer 54, a tunneling dielectric layer 56, and a first semiconductor channel layer 61 can be sequentially deposited as conformal material layers in the inter-stack memory openings 49 and over the upper stack structure (232, 246, 265, 70, 72). The blocking dielectric layer 52 includes a blocking dielectric material such as silicon oxide, a dielectric metal oxide (such as aluminum oxide), or a combination thereof. Alternatively, the blocking dielectric layer 52 may be omitted during this processing step and instead be formed through backside recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack.

In one embodiment, the ONO stack can be formed by deposition of a silicon oxide layer, nitridation of a surface portion of the silicon oxide layer into a silicon oxynitride layer, and oxidation of a surface portion of the silicon oxynitride layer into the second silicon oxide layer. The portion of the silicon oxide layer that is not converted into the silicon oxynitride layer is the first silicon oxide layer within the ONO stack, and the portion of the silicon oxynitride layer that is not converted into the second silicon oxide layer is the silicon oxynitride layer within the ONO stack. Alternatively, the second silicon oxide layer can be formed by deposition of silicon oxide on the inner sidewalls of the silicon oxynitride layer that is formed by nitridation. In one embodiment, the tunneling dielectric layer 56 can include a silicon oxide layer that is substantially free of carbon and/or a silicon oxynitride layer that is substantially free of carbon. The thickness of the tunneling dielectric layer 56 can be in a range from 2 nm to 20 nm, although lesser and greater thicknesses can also be employed.

The first semiconductor channel layer 61 can be formed over the tunneling dielectric layer 56. The first semiconductor channel layer 61 can be deposited directly on the tunneling dielectric layer 56. The first semiconductor channel layer 61 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 61 includes amorphous silicon or polysilicon. The first semiconductor channel layer 61 can be formed by a conformal deposition method such as low pressure chemical vapor deposition (LPCVD). The thickness of the first semiconductor channel layer 61 can be in a range from 2 nm to 10 nm, although lesser and greater thicknesses can also be employed. A cavity is present in each inter-stack memory opening after formation of the first semiconductor channel layer 61.

An anisotropic etch is performed to remove horizontal portions of the first semiconductor channel layer 61, the tunneling dielectric layer 56, the memory material layer 54, and the lower blocking dielectrics 21 and to physically expose a surface of each epitaxial channel portion 11. Each continuous set of remaining portions of the memory material layer 54, the tunneling dielectric layer 56 and optionally the blocking dielectric layer 52 within a same inter-stack memory opening constitutes a memory film 50.

A second semiconductor channel layer 62 can be deposited on remaining vertical portions of the first semiconductor channel layer 61 and on top surface of the epitaxial channel portions 11. The second semiconductor channel layer 62 includes a semiconductor material, which can be any semiconductor material that can be employed for the first semiconductor channel layer 61. The first and second semiconductor channel layers (61, 62) can have a doping of the first conductivity type (i.e., the same conductivity type as the semiconductor material layer 10) or can be substantially intrinsic. As used herein, a semiconductor material is substantially intrinsic if the dopant concentration does not exceed $1.0 \times 10^{16}/cm^3$. In one embodiment, the second semiconductor channel layer 62 can include amorphous silicon or polysilicon. The thickness of the second semiconductor channel layer 62 can be in a range from 2 nm to 10 nm, although lesser and greater thicknesses can also be employed.

In case the cavity in each inter-stack memory opening 49 is not completely filled by the semiconductor channel layers (61, 62), a dielectric core layer can be deposited in the cavities to fill any remaining portion of the cavities within the inter-stack memory openings 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the second insulating cap layer 70 and/or the planarization dielectric layer 72. For example, the horizontal portion of the second semiconductor channel layer 62 located above the top surface of the planarization dielectric layer 72 can be removed by a planarization process, which can employ a recess etch or chemical mechanical planarization (CMP). Each remaining portion of the first and second semiconductor channel layers (61, 62) within an inter-stack memory opening constitutes a semiconductor channel 60, which is a vertical portion of a composite semiconductor channel that further includes a horizontal semiconductor channel that is present between the epitaxial channel portions 11 and the source regions 61 in an upper portion of the semiconductor material layer 10.

The combination of the memory film 50 and the semiconductor channel 60 forms a memory stack structure 55.

Electrical current can flow through the semiconductor channel 60 when a vertical NAND device including the semiconductor channel 60 is turned on. A tunneling dielectric 56 is laterally surrounded by a memory material layer 54, and laterally surrounds a portion of the semiconductor channel 60. Each memory film 50 can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch. Each remaining portion of the dielectric core layer constitutes a dielectric core 62. A drain region 63 can be formed by depositing a doped semiconductor material within each recessed region above the dielectric cores 62. The doped semiconductor material can be, for example, doped polysilicon. Excess portions of the deposited semiconductor material can be removed from above the top surface of the planarization dielectric layer 72, for example, by chemical mechanical planarization (CMP) or a recess etch to form the drain region 63.

Figure 11A:
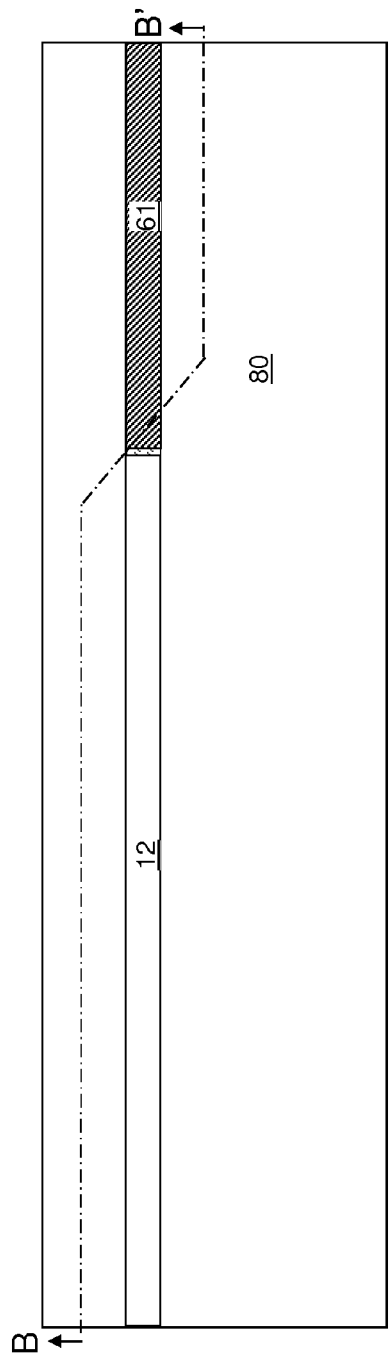
FIG. 11A is a top-down view of the first exemplary structure after formation of backside trenches according to the first embodiment of the present disclosure.
Figure 11B:
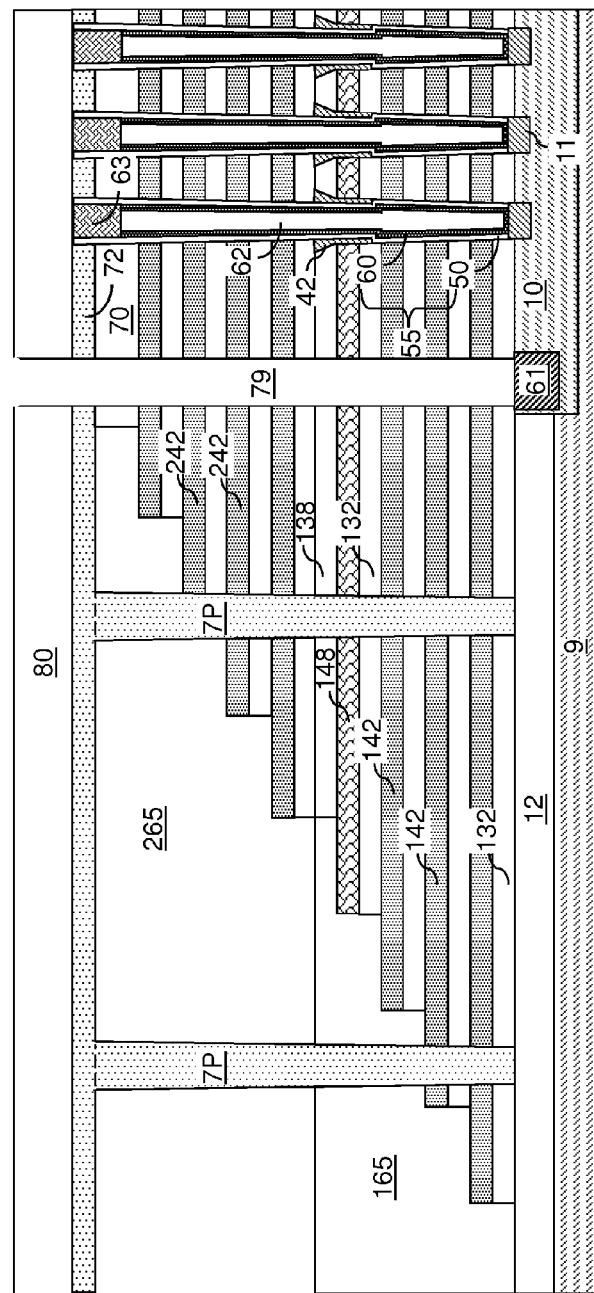
FIG. 11B is a vertical cross-sectional view of the first exemplary structure of FIG. 11A along the vertical plane B-B'.

Referring to FIGS. 11A and 11B, a contact level dielectric layer 80 can be optionally deposited over the upper stack structure (232, 242, 265, 70, 72). The contact level dielectric layer 80 includes a dielectric material that is different from the material of the second sacrificial fill material layers 242. For example, the contact level dielectric layer 80 can include silicon oxide. The thickness of the contact level dielectric layer 80 can be in a range from 20 nm to 500 nm, although lesser and greater thicknesses can also be employed.

At least one contact trench 79 can be formed through the upper and lower stack structures, for example, by applying a photoresist layer (not shown), lithographically patterning the photoresist layer, and transferring the pattern in the photoresist layer through the upper and lower stack structures employing an anisotropic etch. The anisotropic etch that forms the at least one contact trench 79 can stop on the substrate (9, 10). Dopants of a second conductivity type, which is the opposite of the first conductivity type of the semiconductor material layer 10, can be implanted into a surface portion of the semiconductor material layer 10 to form a source region 61 underneath the bottom surface of each contact trench 79. The photoresist layer can be subsequently removed, for example, by ashing.

Figure 12A:
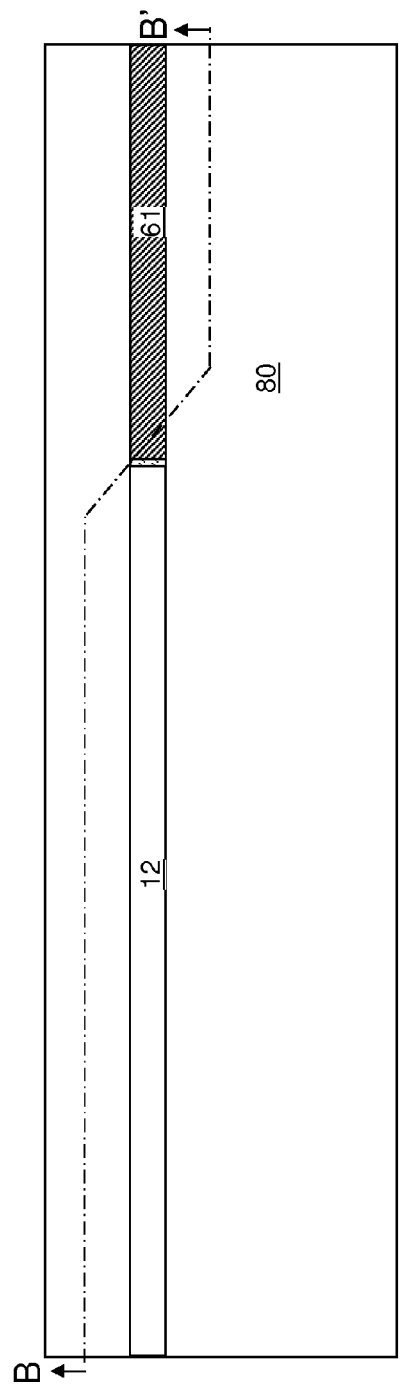
FIG. 12A is a top-down view of the first exemplary structure after formation of backside recesses according to the first embodiment of the present disclosure.
Figure 12B:
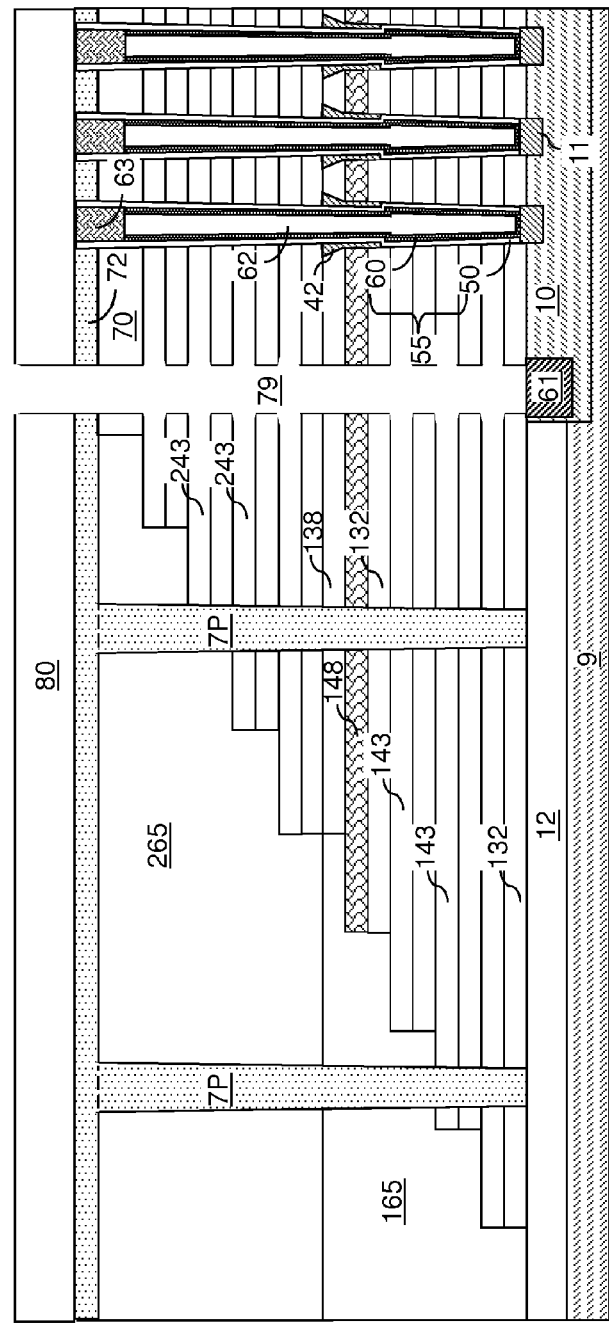
FIG. 12B is a vertical cross-sectional view of the first exemplary structure of FIG. 12A along the vertical plane B-B'.

Referring to FIGS. 12A and 12B, an etchant that selectively etches the materials of the first and second sacrificial material layers (142, 242) with respect to the materials of the first and second insulating layers (132, 232) and the first and second dielectric cap layers (138, 70) can be introduced into the contact trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. The removal of the materials of the first and second sacrificial material layers (142, 242) can be selective to the materials of the first and second insulating layers (132, 232), the materials of the first and second retro-stepped dielectric material portions (165, 265), the material of the pillar structures 7P, and the material of the blocking dielectric layers 52. In one embodiment, the first and second sacrificial material layers (142, 242) can include silicon nitride, and the materials of the first and second insulating layers (132, 232), and the first and second retro-stepped dielectric material portions (165,265) can be selected from silicon oxide and dielectric metal oxides. In another embodiment, the first and second sacrificial material layers (142, 242) can include a semiconductor material such as germanium or a silicon-germanium alloy, and the materials of the second insulating layers 232 and the first and second retro-stepped dielectric material portions (165, 265) can be selected from silicon oxide, silicon nitride, and dielectric metal oxides.

The isotropic etch process can be a wet etch process employing a wet etch solution, or can be a gas phase (dry) etch process in which the etchant is introduced in a vapor phase into the contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate (9, 10). A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout. Optionally, a backside blocking dielectric layer can be formed in the backside recesses.

Referring to FIGS. 13A and 13B, at least one conductive material can be deposited in the plurality of backside recesses (143, 243), on the sidewalls of the contact trench 79, and over the contact level dielectric layer 80. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer can be formed on the sidewalls of each contact trench 79 and over the contact level dielectric layer 80. In embodiments in which the first spacer material layers and the second spacer material layers are provided as first sacrificial material layers 142 and second sacrificial material layers 242, the first and second sacrificial material layers (142, 242) can be replaced with first and second conductive material layers (146, 246), respectively. Specifically, each first sacrificial material layer 142 can be replaced with a first electrically conductive layer 146, and each second sacrificial material layer 242 can be replaced with a second electrically conductive layer 246. A backside cavity is present in the portion of each contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each contact trench 79 and from above the contact level dielectric layer 80, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

Each electrically conductive layer (146, 246) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including the memory stack structures 55.

Referring to FIGS. 14A and 14B, an insulating spacer 74 including a dielectric material can be formed at the periphery of each contact trench 79, for example, by deposition of a conformal insulating material (such as silicon oxide) and a subsequent anisotropic etch. A backside contact via structure 76 can be formed in the remaining volume of each contact trench 79, for example, by deposition of a conductive material and removal of excess portions of the deposited conductive material from above a horizontal plane including the top surface of the contact level dielectric layer by a planarization process such as chemical mechanical planarization or a recess etch.

Additional contact via structures (88, 66) can be formed though the contact level dielectric layer 80 and optionally through the second and/or first retro-stepped dielectric material portion (165, 265) to provide electrical contact to various conductive nodes within the first exemplary structure. The additional contact via structures (88, 66) can include, for example, drain contact via structures 88 and control gate contact via structures 66.

The first exemplary structure can include a monolithic three-dimensional memory device. The monolithic three-dimensional memory device can include a lower stack structure (132, 146, 138, 148, 165) comprising a first alternating stack including first insulating layers 132 and first electrically conductive layers 146 and located over a substrate (9, 10); an upper stack structure (232, 246, 70, 265) comprising a second alternating stack including second insulating layers 232 and second electrically conductive layers 246 and located over the lower stack structure (132, 146, 138, 148, 165); at least one memory stack structure 55 extending through the lower stack structure (132, 146, 138, 148, 165) and the upper stack structure (232, 246, 70, 265); and an electrode (i.e., the joint region electrode (148, 42)) overlying the first electrically conductive layers 146 and underlying the second electrically conductive layers 246, and comprising a layer portion 148 having a uniform thickness and a collar portion 42 that laterally surrounds each of the at least one memory stack structure 55 and having a greater vertical extent (i.e., in the direction perpendicular to the top surface of the substrate) than the uniform thickness of the layer portion 148. In other words, the collar portion 42 adjacent to structures 55 may be thicker than the layer portion 148 which is farther from the structures 55 than portion 42.

In one embodiment, a topmost horizontal surface of the collar portion 42 can be located above a horizontal plane including a top surface of the layer portion 148 of the electrode (148, 42). The topmost horizontal surface of the collar portion 42 can be within a same horizontal plane as a top surface of a topmost insulator layer, i.e., the first dielectric cap layer 138) within the lower stack structure (132, 146, 138, 148, 165). In one embodiment, a bottommost horizontal surface of the collar portion 42 can be located above a horizontal plane including a bottom surface of a first insulating layer 132 (i.e., the topmost first insulating layer 132) that contacts the electrode (148, 42).

In one embodiment, the collar portion 42 can have an upper tapered sidewall and a lower tapered sidewall having a less taper angle than the upper tapered sidewall. The upper tapered sidewall can be the sidewall of the first dielectric cap layer 138, and the lower tapered sidewall can be the sidewall of the conductive material layer 148 and the topmost first insulating layer 132. In one embodiment, the collar portion 42 can comprise a semiconductor material. In one embodiment, the layer portion 148 can comprise another semiconductor material having a different material composition than the semiconductor material of the collar portion 42. In one embodiment, the electrode (148, 42) can comprise a different material than the first and second electrically conductive layers (146, 246). The electrode (148, 42) can be located within the lower stack structure (132, 146, 138, 148, 165).

Each second electrically conductive layer 246 that underlies at least another second electrically conductive layer 246 can laterally extend farther than any overlying layer among the second electrically conductive layers 246. Each first electrically conductive layer 146 that underlies at least another first electrically conductive layer 146 can laterally extend farther than any overlying layer among the first electrically conductive layers 146.

In one embodiment, the lower stack structure can further comprises a first dielectric material portion, e.g., the first retro-stepped dielectric material portion 165, located on, and over, first stepped surfaces of the first alternating stack (132, 146), and the upper stack structure can further comprises a second dielectric material portion, e.g., the second retro-stepped dielectric material portion 265, located on, and over, second stepped surfaces of the second alternating stack (232, 246). The first stepped surfaces and the second stepped surfaces can be located within a contact region, and a subset of control gate contact via structures 66 extends through the first dielectric material portion and the second dielectric material portion.

In one embodiment, the monolithic three-dimensional memory structure comprises a monolithic three-dimensional NAND memory device. The first and second electrically conductive layers can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Figure 15:
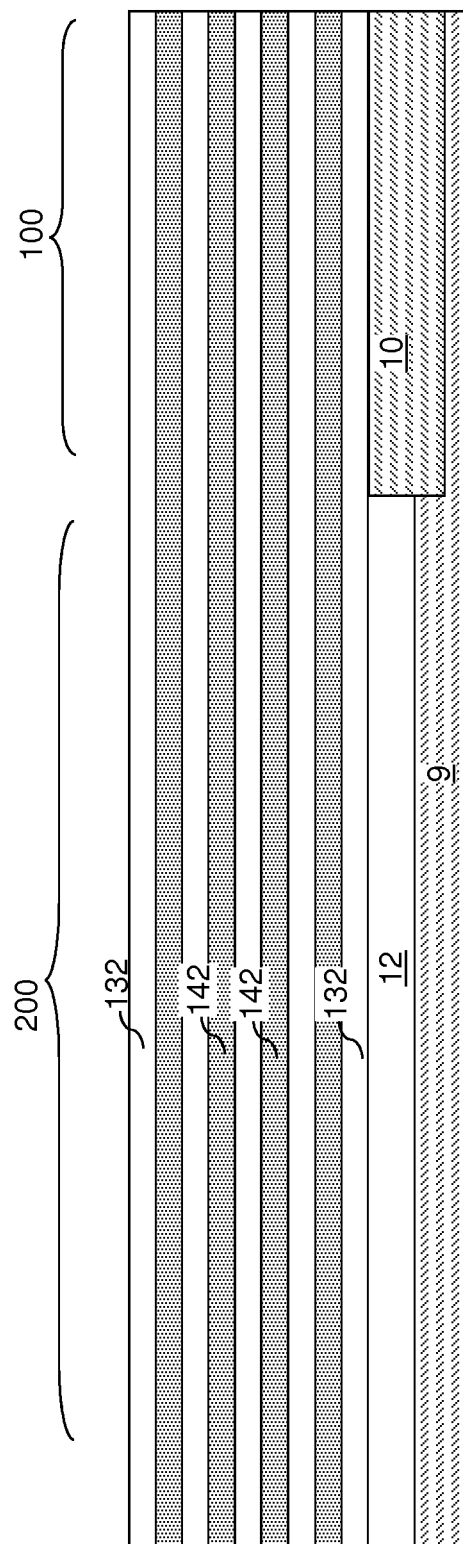
FIG. 15 is a vertical cross-sectional view of a second exemplary structure after formation of a first alternating stack of first insulating layers and first sacrificial material layers according to a second embodiment of the present disclosure.

Referring to FIG. 15, a second exemplary structure according to a second embodiment of the present disclosure is illustrated, which can be derived from the first exemplary structure of FIG. 1 by omitting formation of the conductive material layer 148 and the first dielectric cap layer 138.

Figure 16:
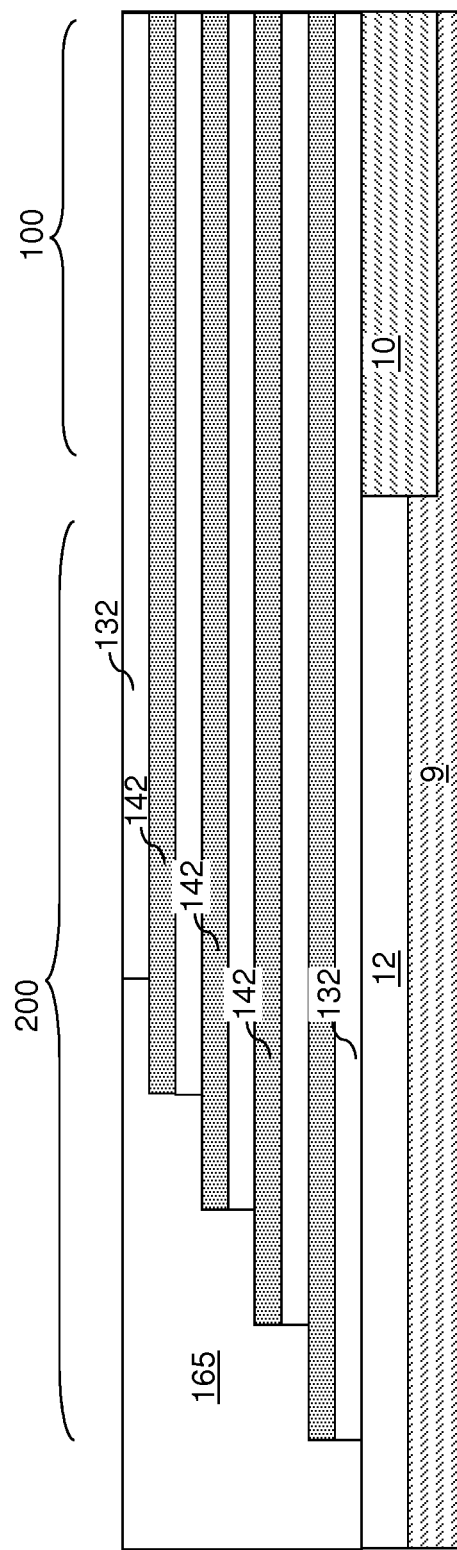
FIG. 16 is a vertical cross-sectional view of the second exemplary structure after formation of first stepped surfaces and a first retro-stepped dielectric material portion according to the second embodiment of the present disclosure.

Referring to FIG. 16, a first retro-stepped dielectric material portion 165 can be formed in the first alternating stack (132, 142) by performing the processing steps of FIGS. 2A and 2B. If a planarization process is employed to form the first retro-stepped dielectric material portion 165, the topmost first insulating layer 132 can be employed as the stopping layer for the planarization process. The first alternating stack (132, 142) and the first retro-stepped dielectric material portion 165 collectively constitute a lower stack structure (132, 142, 165).

Figure 17A:
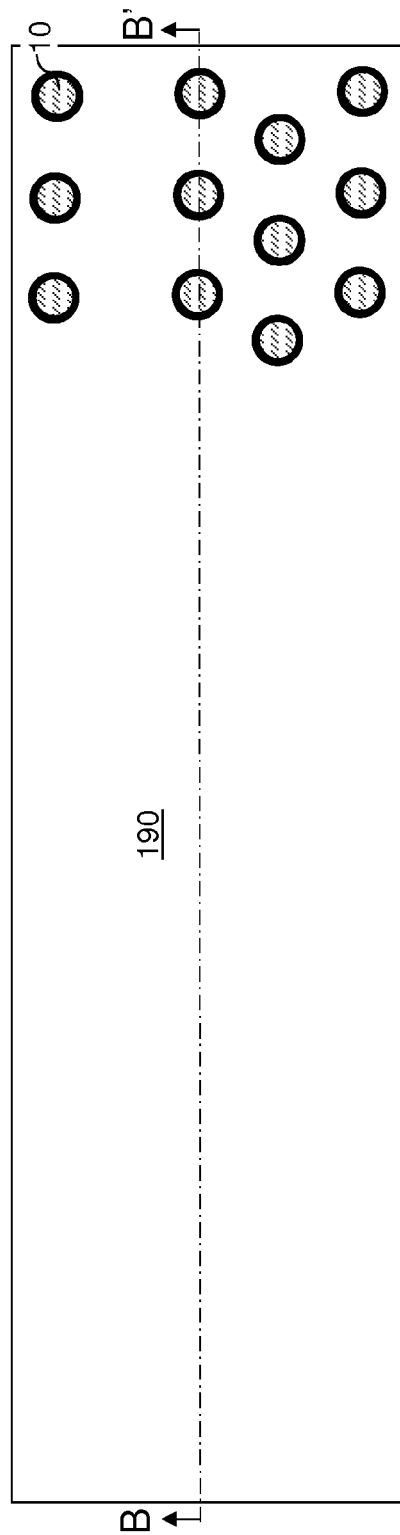
FIG. 17A is a top-down view of the second exemplary structure after formation of first memory openings in a device region according to the second embodiment of the present disclosure.
Figure 17B:
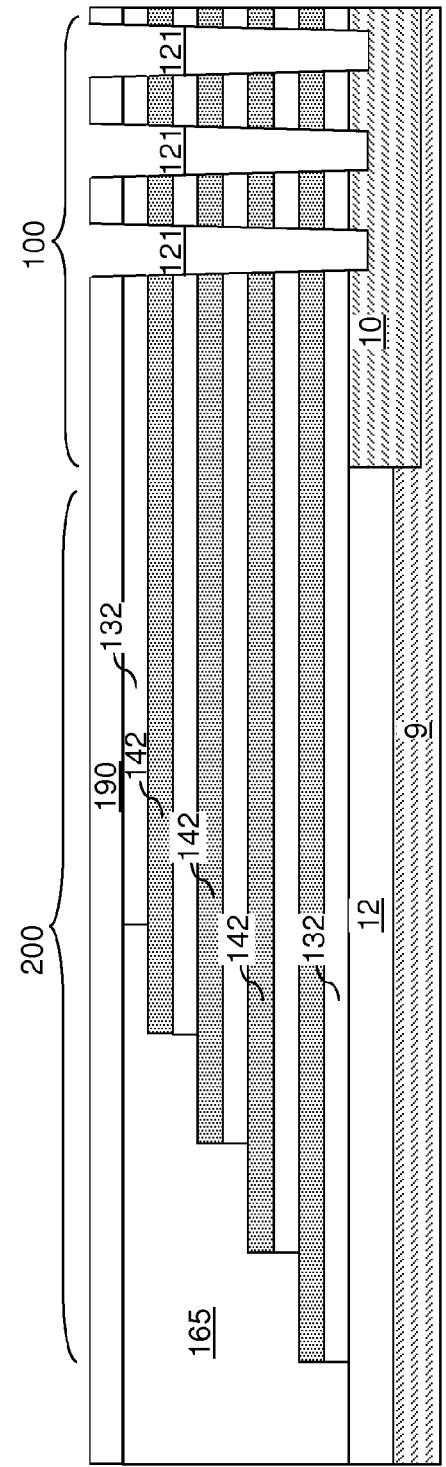
FIG. 17B is a vertical cross-sectional view of the second exemplary structure of FIG. 17A along the vertical plane B-B'.

Referring to FIGS. 17A and 17B, a dielectric material layer 190 can be formed over the lower stack structure (132, 142, 165). The dielectric material layer 190 functions as a dielectric cap layer for the lower stack structure (132, 142, 165), and is herein referred to as a first dielectric cap layer. The dielectric material layer 190 is a dielectric material layer that includes a dielectric material that is different form the material of the first sacrificial material layers 142. In one embodiment, the dielectric material layer 190 can include the same dielectric material as the first insulating layers 132. The thickness of the dielectric material layer 190 can be in a range from 20 nm to 300 nm, although lesser and greater thicknesses can also be employed.

First memory openings 121 can be formed through the dielectric material layer 190 and the lower stack structure (132, 143, 165) by performing the processing steps of FIGS. 3A and 3B such that the dielectric material layer 190 is employed in lieu of the first dielectric cap layer 138. The optional tapering of the sidewalls of a topmost dielectric layer (i.e., the topmost first insulating layer 132) within the lower stack structure (132, 142, 165) may be omitted, or may be performed.

Figure 18A:
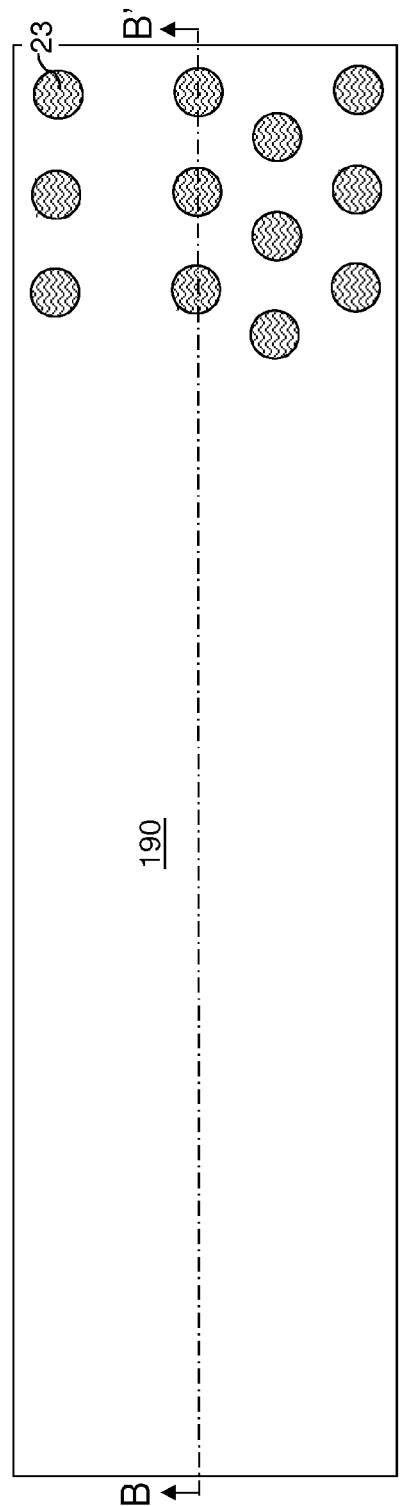
FIG. 18A is a top-down view of the second exemplary structure after formation of sacrificial memory opening fill portions in lower portions of the first memory openings according to the second embodiment of the present disclosure.
Figure 18B:
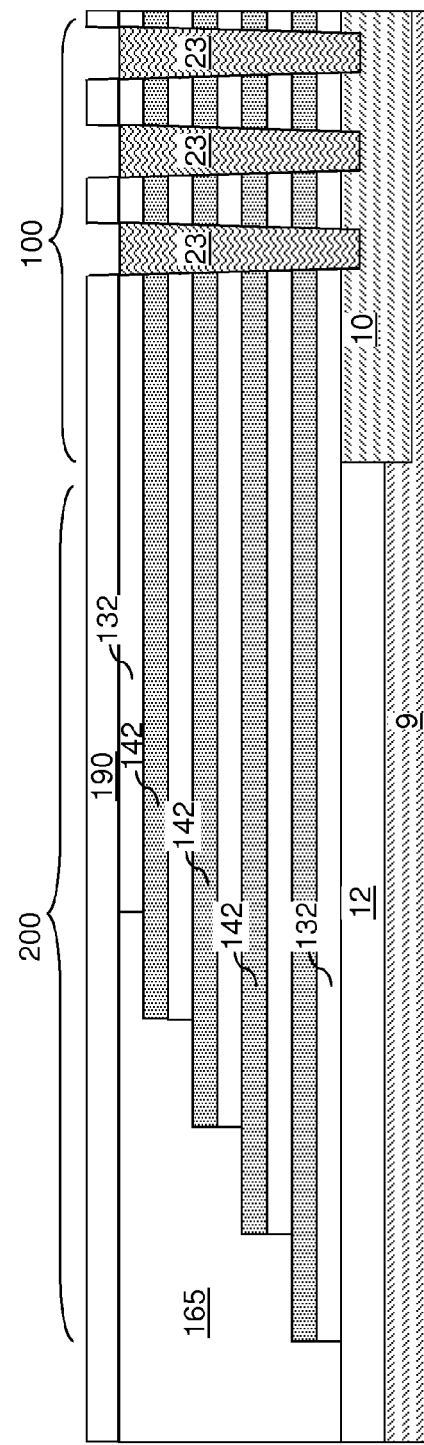
FIG. 18B is a vertical cross-sectional view of the second exemplary structure of FIG. 18A along the vertical plane B-B'.

Referring to FIGS. 18A and 18B, a sacrificial fill material is deposited in the first memory openings 121. The sacrificial fill material is a material that can be removed selective to the materials of the first insulating layers 132, the first sacrificial material layer 142, and the semiconductor material layer 10. In one embodiment, the first sacrificial fill material can include a semiconductor material such as germanium or a silicon-germanium alloy. Alternatively, the sacrificial fill material can include amorphous carbon, diamond-like carbon, or a porous organosilicate glass. Excess portions of the sacrificial fill material above the horizontal plane including the topmost surface of the lower stack structure (132, 142, 165) (such as the top surface of the topmost first insulating layer 132) can be removed by a planarization process, which can be, for example, a chemical mechanical planarization (CMP) process and/or a recess etch process. Further, the sacrificial fill material can be subsequently recessed such that the top surface of the recessed portions of the sacrificial fill material in the first memory openings 121 is located between the horizontal plane including the top surface of the topmost first sacrificial material layer 142 and the top surface of the dielectric material layer 190. Each remaining portion of the sacrificial fill material fills a lower portion of a first memory opening, and constitutes a sacrificial memory opening fill portion 23. Each sacrificial memory opening fill portion 23 can vertically extend from the bottom surface of a respective first memory opening 121 to a level that is located above the top surface of the topmost first sacrificial material layer 142.

Figure 19A:
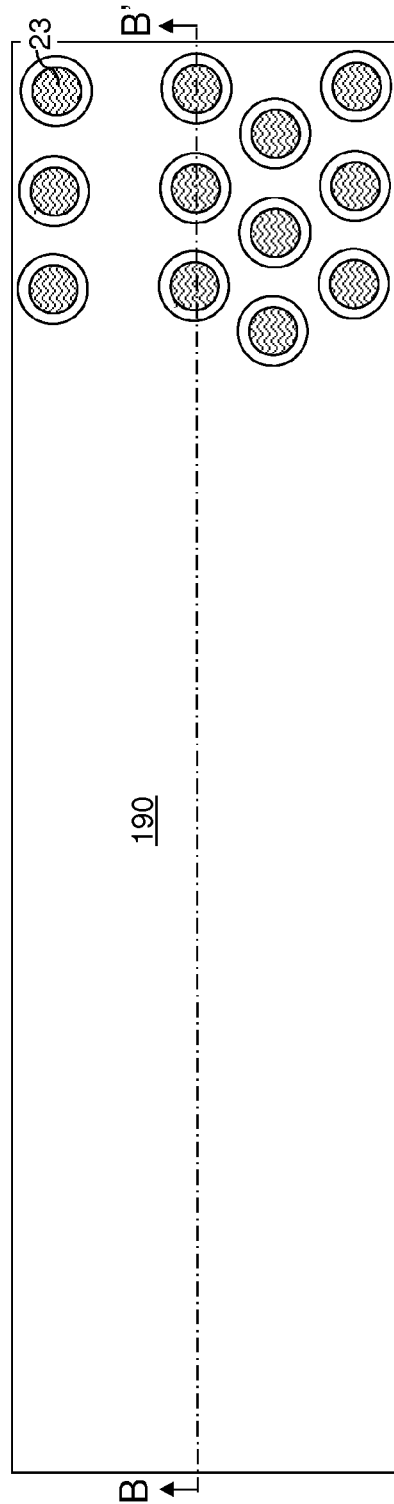
FIG. 19A is a top-down view of the second exemplary structure after laterally expanding an upper portion of the first memory openings according to the second embodiment of the present disclosure.
Figure 19B:
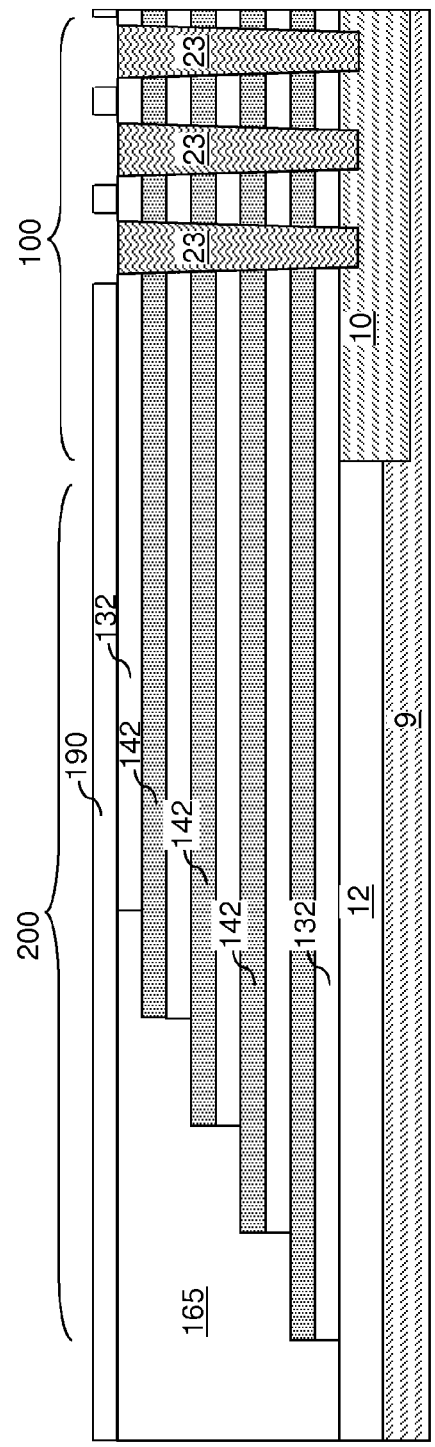
FIG. 19B is a vertical cross-sectional view of the second exemplary structure of FIG. 19A along the vertical plane B-B'.

Referring to FIGS. 19A and 19B, the cavities at the upper portions of the first memory openings 121 can be optionally laterally expanded by an etch process. In one embodiment, a wet etch process that isotropically etches the dielectric material of the dielectric material layer 190 can be employed to laterally expand the cavities overlying the sacrificial memory opening fill portions 23. In one embodiment, if the dielectric material layer 190 includes silicon oxide, a wet etch employing hydrofluoric acid may be employed. The lateral expansion of the cavities can be controlled to avoid merging of the cavities.

Figure 20A:
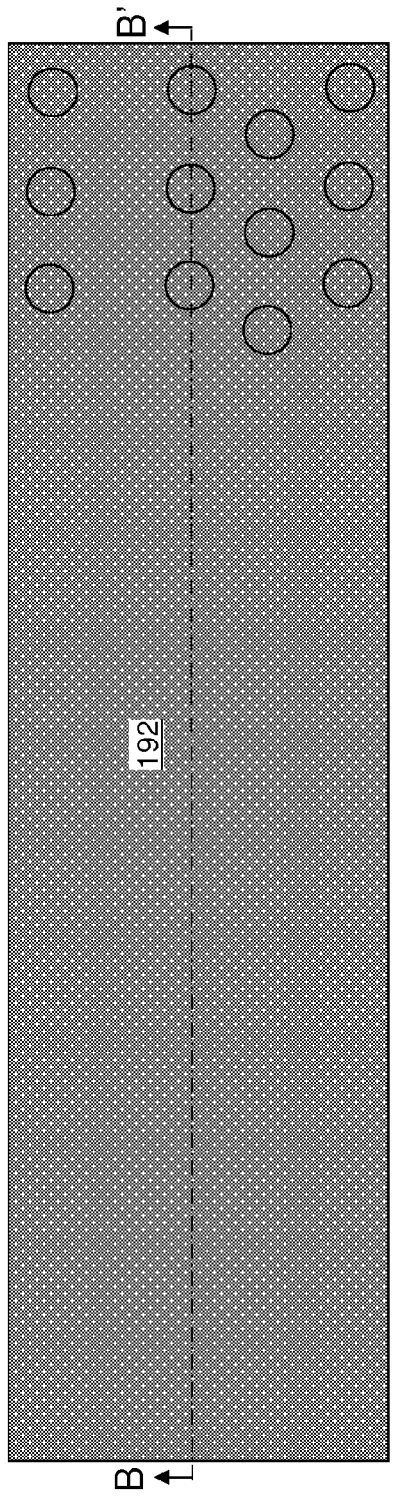
FIG. 20A is a top-down view of the second exemplary structure after forming a sacrificial liner according to the second embodiment of the present disclosure.
Figure 20B:
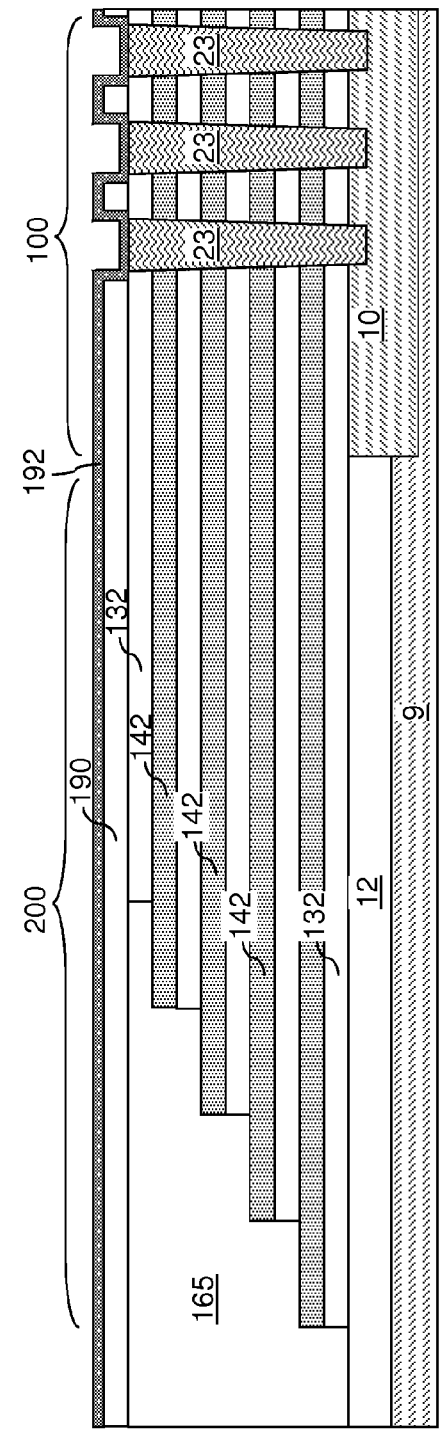
FIG. 20B is a vertical cross-sectional view of the second exemplary structure of FIG. 20A along the vertical plane B-B'.

Referring to FIGS. 20A and 20B, a sacrificial liner 192 can be formed over the sacrificial memory opening fill portions 23 and over the lower stack structure (132, 142, 165). In one embodiment, the sacrificial liner 192 can be deposited on the top surfaces of the sacrificial memory opening fill portions 23 and on the top surface and sidewalls of the dielectric material layer 190. The sacrificial liner 192 includes a sacrificial material that can be subsequently removed selective to the material of the dielectric material layer 190 and may comprise the same material as that of the sacrificial material layers 142. In one embodiment, the dielectric material layer 190 can include silicon oxide, and the sacrificial liner 192 can include silicon nitride. The sacrificial liner 192 can be deposited by a conformal deposition process such as chemical vapor deposition (CVD) or atomic layer deposition (ALD). The thickness of the sacrificial liner 192 can be in a range from 2 nm to 100 nm, and/or can be in a range from 4 nm to 20 nm, although lesser and greater thicknesses can also be employed.

Figure 21A:
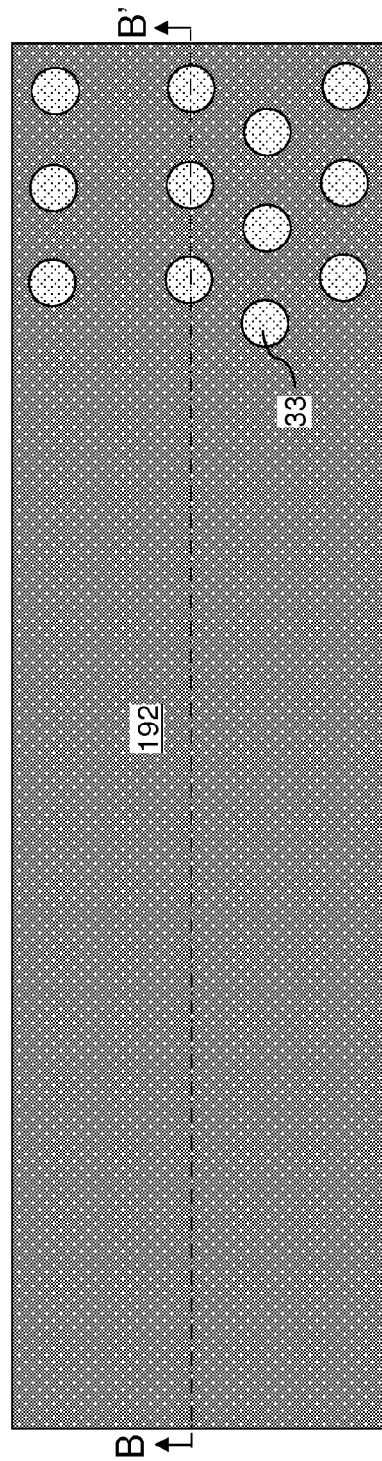
FIG. 21A is a top-down view of the second exemplary structure after formation of fill material structures according to the second embodiment of the present disclosure.
Figure 21B:
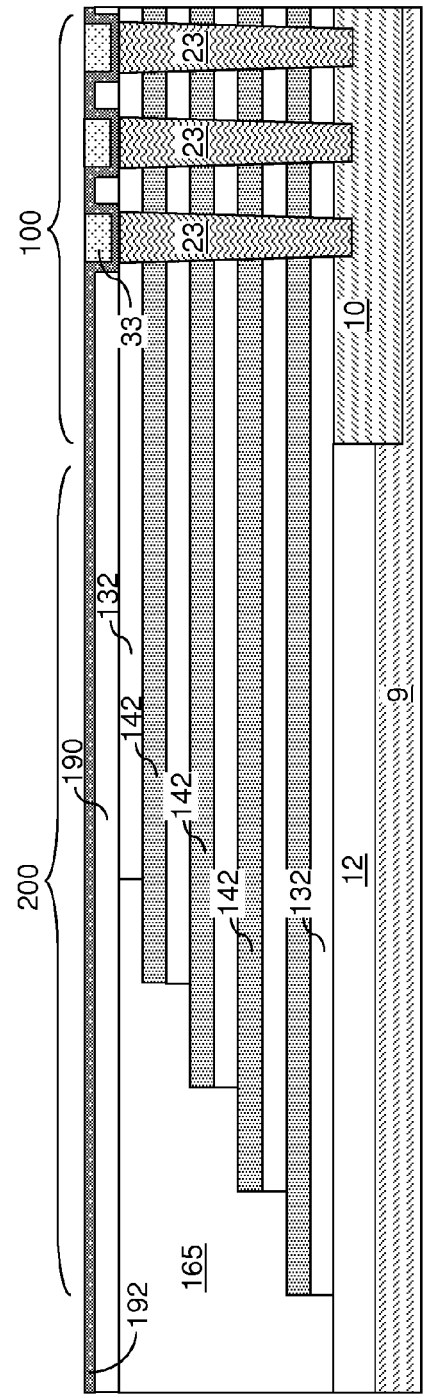
FIG. 21B is a vertical cross-sectional view of the second exemplary structure of FIG. 21A along the vertical plane B-B'.

Referring to FIGS. 21A and 21B, a fill material is deposited in the cavities overlying the sacrificial memory opening fill portions 23 and laterally surrounded by vertical portions of the sacrificial liner 192. The fill material can include a semiconductor material such as polysilicon or amorphous silicon, a silicon-germanium alloy, or a III-V compound semiconductor material. Alternatively, the fill material can include amorphous carbon, diamond-like carbon, porous or non-porous organosilicate glass, or a dielectric material that can be removed selective to the material of the sacrificial liner 192. The fill material can be planarized employing the top surface of the sacrificial liner 192 as a stopping layer to form fill material structures 33. Each fill material structure 33 fills a respective cavity overlying a sacrificial memory opening fill portion 23 and laterally surrounded by a vertical portion of the sacrificial liner 192. Each fill material structure 33 fills an upper region of a respective first memory opening 121.

Referring to FIGS. 22A and 22B, the processing steps of FIGS. 6A and 6B can be performed to form a second alternating stack of second insulating layers 232 and second spacer material layers. In one embodiment, the second spacer material layers can be second sacrificial material layers 242, and the second alternating stack can include second insulating layers 232 and second sacrificial material layers 242. A second dielectric cap layer 70 can be formed over the second alternating stack (232, 242). The bottommost layer of the second alternating stack (232, 242) may be a second sacrificial material layer 242 or a second insulating layer 232. In one embodiment, the bottommost second spacer material layers (such as the bottommost second sacrificial material layer 242) may be formed on the top surface of the sacrificial liner 192 and on the top surfaces of the fill material structures 33.

Referring to FIGS. 23A and 23B, second stepped surfaces and a second retro-stepped dielectric material portion 265 can be formed by performing the processing steps of FIGS. 7A and 7B as in the first embodiment.

Referring to FIGS. 24A and 24B, support pillar structures 7P and an optional planarization dielectric layer 72 may be formed by performing the processing steps of FIGS. 7A and 7B as in the first embodiment.

Referring to FIGS. 25A and 25B, second memory openings 221 can be formed through the upper (second) stack structure (190, 192, 232, 242, 70, 265, 72) employing the processing steps of FIGS. 8A and 8B as in the first embodiment. The anisotropic etch that forms the second memory openings 221 may, or may not, be selective to the material of the fill material structures 33. The second memory openings 221 vertically extend from the horizontal plane including the topmost surface of the upper stack structure (190, 192, 232, 242, 70, 265, 72) at least to the top surface of the fill material structures 33.

Referring to FIGS. 26A and 26B, in case the second memory openings 221 do not vertically extend to the horizontal portions of the sacrificial liner 192 overlying the sacrificial memory opening fill portions 23, the second memory openings 221 can be vertically extended by another anisotropic etch until the top surfaces of the recessed portions of the sacrificial liner 192 are physically exposed. In one embodiment, the entirety of the fill material structures 33 can be removed during the extension of the second memory openings 221 at this process step. In one embodiment, the anisotropic etch can remove the entirety of the fill material structures 33. In another embodiment, an isotropic etch that removes the material of the fill material structures 33 can be performed to remove peripheral portions of the fill material structures 33 that are proximal to the vertical portions of the sacrificial liner 192.

Referring to FIGS. 27A and 27B, another anisotropic etch process is performed to remove recessed horizontal portions of the sacrificial liner 192 that are physically exposed at the bottom of each second memory opening 221. The anisotropic etch process vertically extends the second memory openings 221 through the sacrificial liner 192. Vertical portions of the sacrificial liner 192 are not removed, and remain around each second memory opening 221 as annular structures.

Figure 28A:
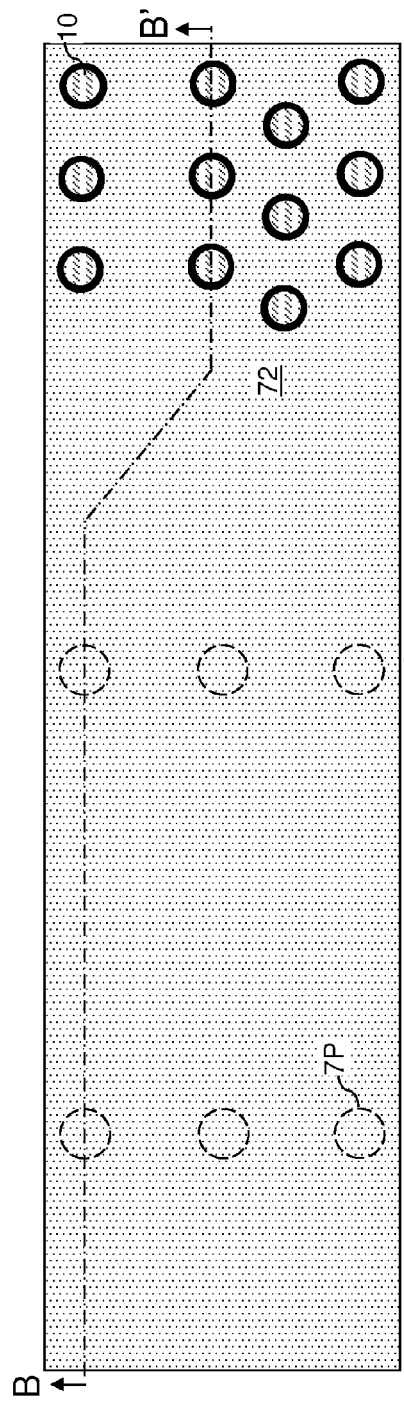
FIG. 28A is a top-down view of the second exemplary structure after removal of sacrificial memory opening fill portions according to the second embodiment of the present disclosure.
Figure 28B:
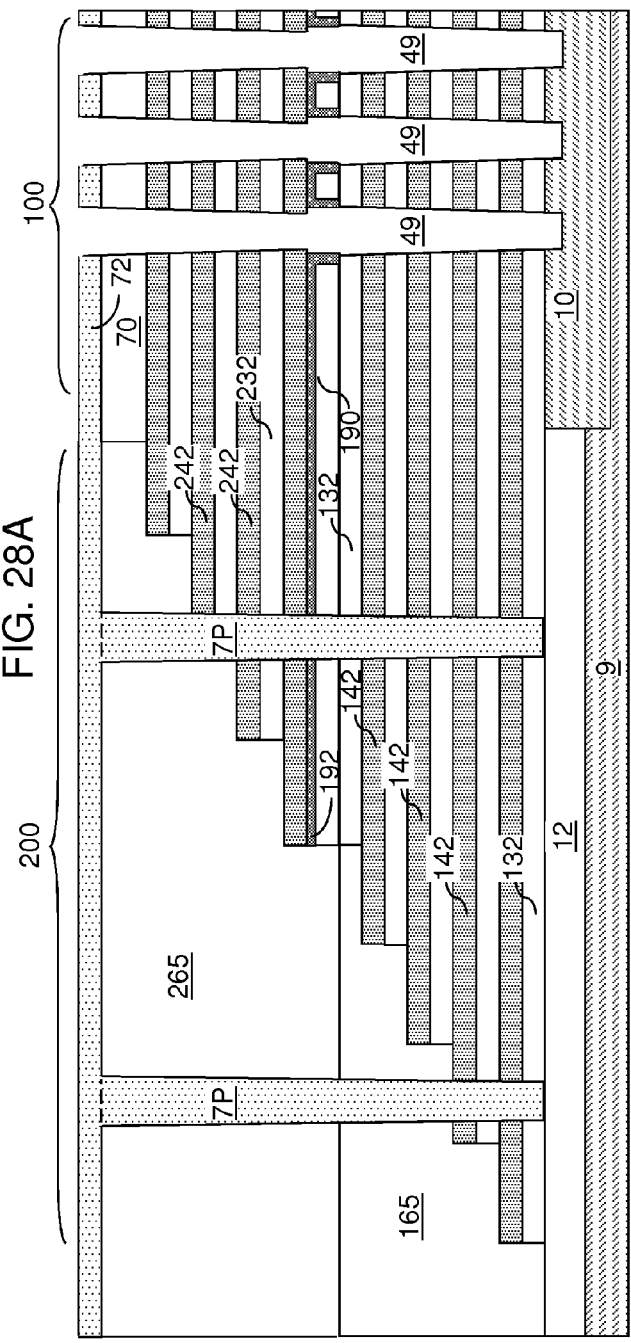
FIG. 28B is a vertical cross-sectional view of the second exemplary structure of FIG. 28A along the vertical plane B-B'.

Referring to FIGS. 28A and 28B, the sacrificial memory opening fill portions 23 are removed by an etch process, which can be an anisotropic etch process and/or an isotropic etch process. The removal of the sacrificial memory opening fill portions 23 can be performed selective to the material of the first and second insulating layers (132, 232), the first and second sacrificial material layers (142, 242), the dielectric material layer 190, the second dielectric cap layer 70, and the semiconductor material layer 10. A suitable surface clean process can be subsequently performed as needed. The second memory openings 221 are further vertically extended to form inter-stack memory openings 49 that extend through the lower and upper stack structures.

Referring to FIGS. 29A and 29B, the processing steps of FIGS. 10A-10C can be performed to form memory stack structures 55 in the inter-stack memory openings 49. In this embodiment, the epitaxial channel portions 11 are optional and may either be present or omitted as desired.

Figure 30A:
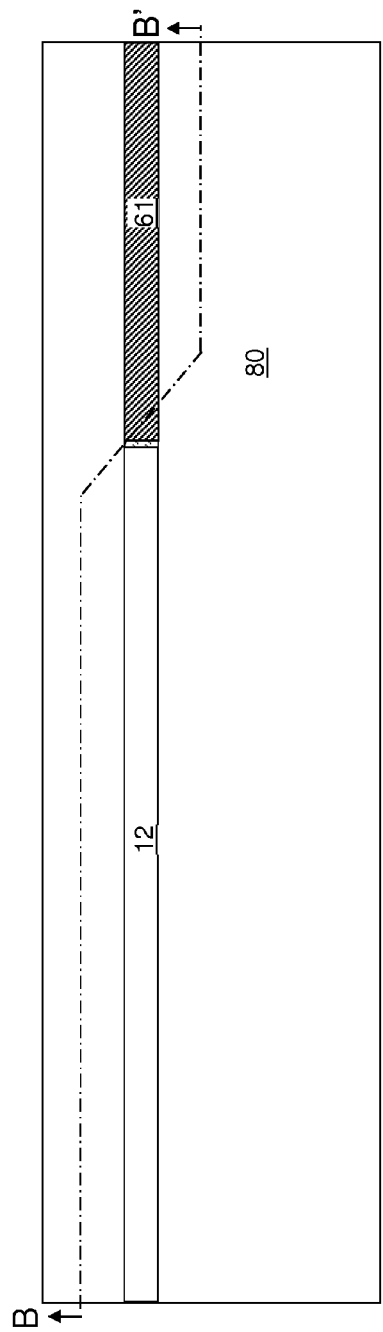
FIG. 30A is a top-down view of the second exemplary structure after formation of backside trenches according to the second embodiment of the present disclosure.
Figure 30B:
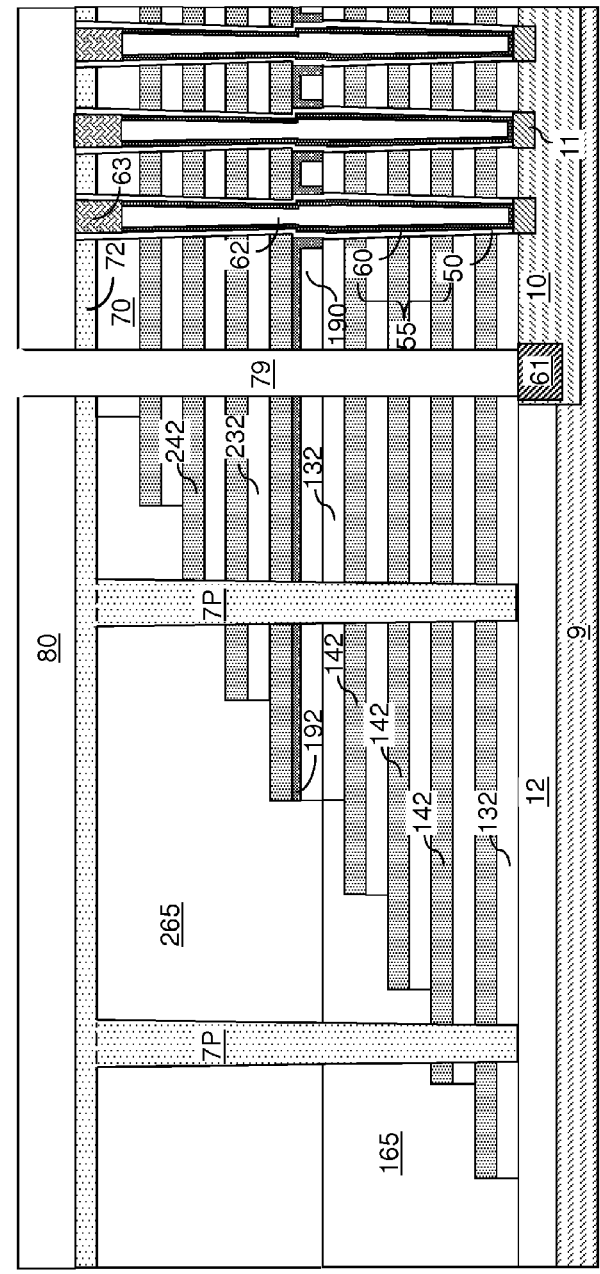
FIG. 30B is a vertical cross-sectional view of the second exemplary structure of FIG. 30A along the vertical plane B-B'.

Referring to FIGS. 30A and 30B, the processing steps of FIGS. 11A and 11B can be performed to form at least one backside trench 79 and at least one source region 61.

Figure 31A:
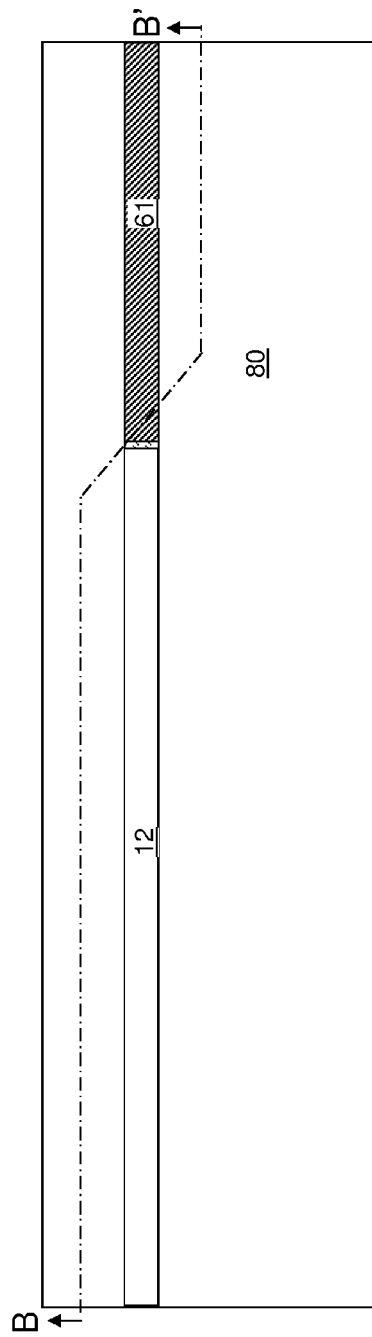
FIG. 31A is a top-down view of the second exemplary structure after formation of backside recesses according to the second embodiment of the present disclosure.
Figure 31B:
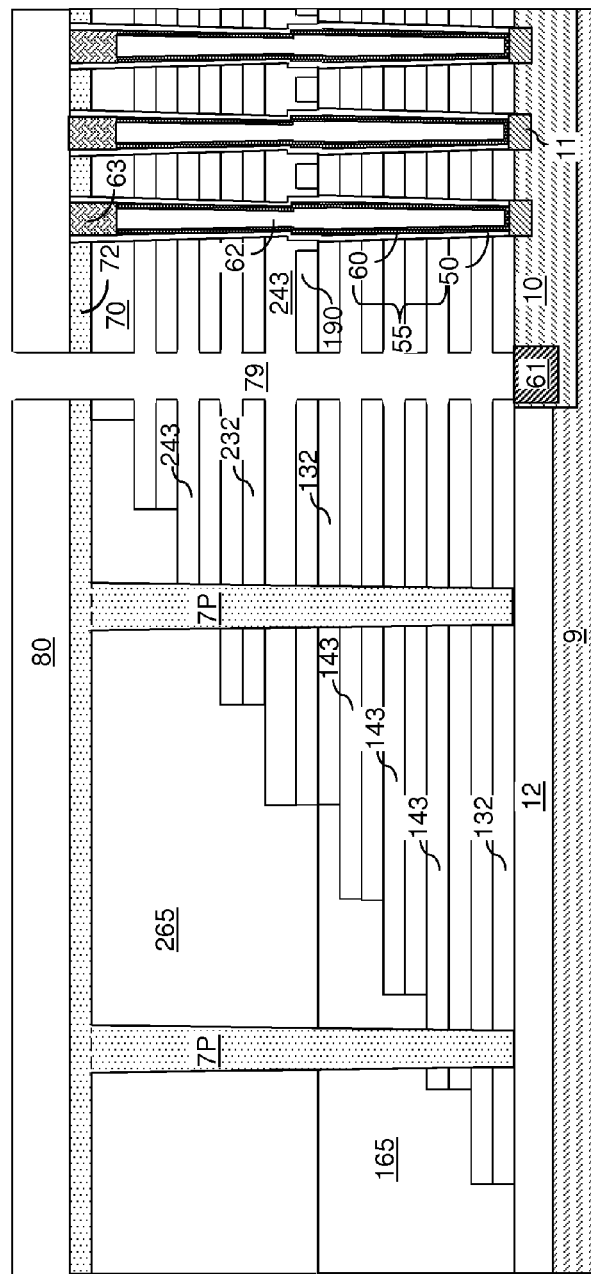
FIG. 31B is a vertical cross-sectional view of the second exemplary structure of FIG. 31A along the vertical plane B-B'.

Referring to FIGS. 31A and 31B, the first spacer material layers and the second spacer material layers can be provided as first sacrificial material layers 142 and second sacrificial material layers 242, the first and second sacrificial material layers (142, 242) can be replaced with first and second conductive material layers (146, 246), respectively. In this case, the processing steps of FIGS. 12A and 12B can be performed to form backside recesses (143, 243). The bottommost second sacrificial material layer 242 and the sacrificial liner 192 can be removed simultaneously to form a combined second backside recess 243, which is the bottommost second backside recess 243. The entirety of the sacrificial liner 192 (including the vertical portions of the sacrificial liner 192) is removed during removal of the second sacrificial material layers 242.

Figure 32A:
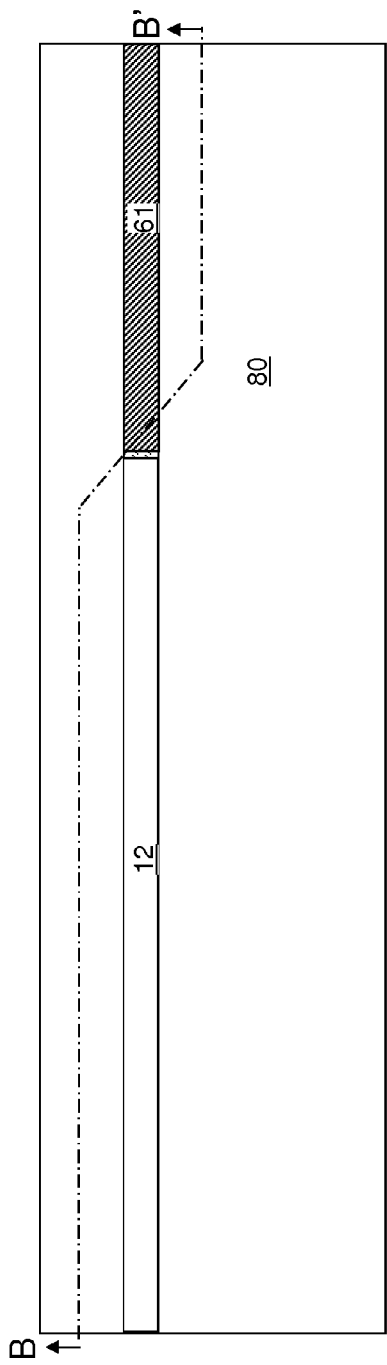
FIG. 32A is a top-down view of the second exemplary structure after formation of electrically conductive layers and a joint region electrode according to the second embodiment of the present disclosure.
Figure 32B:
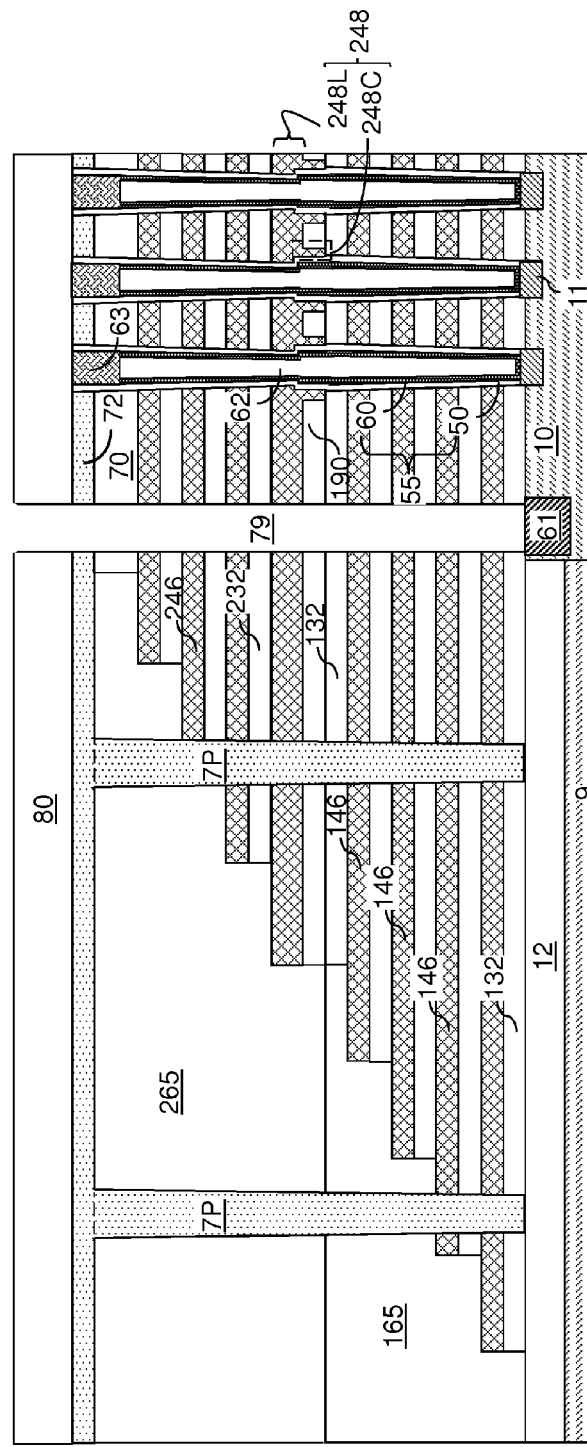
FIG. 32B is a vertical cross-sectional view of the second exemplary structure of FIG. 32A along the vertical plane B-B'.

Referring to FIGS. 32A and 32B, the processing steps of FIGS. 13A and 13B can be performed to form first electrically conductive layers 146 at each level of the first backside recesses 143, an electrode 248 (which is herein referred to as a joint region electrode because this electrode is formed in the joint region located in proximity to the interface between the lower stack structure and the upper stack structure) at the level of the bottommost second sacrificial material layer 242 and the sacrificial liner 192, and second electrically conductive layers 246 at each level of the second backside recesses 246. Thus, the electrode 248 is formed concurrently with formation of the second conductive material layers 246. The electrode 248 can include a layer portion 248L having a uniform thickness and at least one collar portion 248C that laterally surrounds a respective memory stack structure 55 and having a greater vertical extent than the uniform thickness of the layer portion 248L. Specifically, the electrode 248 can include one layer portion 248L connected to a plurality of collar portions 248C, where each collar portion surrounds a middle portion of a respective memory stack structure 55.

The volume of a backside blocking dielectric layer, if present, is less than the volume of the first and second electrically conductive layers (146, 246) and the electrode 248. Thus, the electrode 248 can be formed by replacing a predominant portion of a volume that includes at least the vertical portion of the sacrificial liner 192 and a horizontal portion of the sacrificial liner 192 that overlies the lower stack structure with a conductive material. Further, a predominant portion of the bottommost sacrificial material layer 242 can be replaced with the conductive material to provide the electrode 248.

Figure 33A:
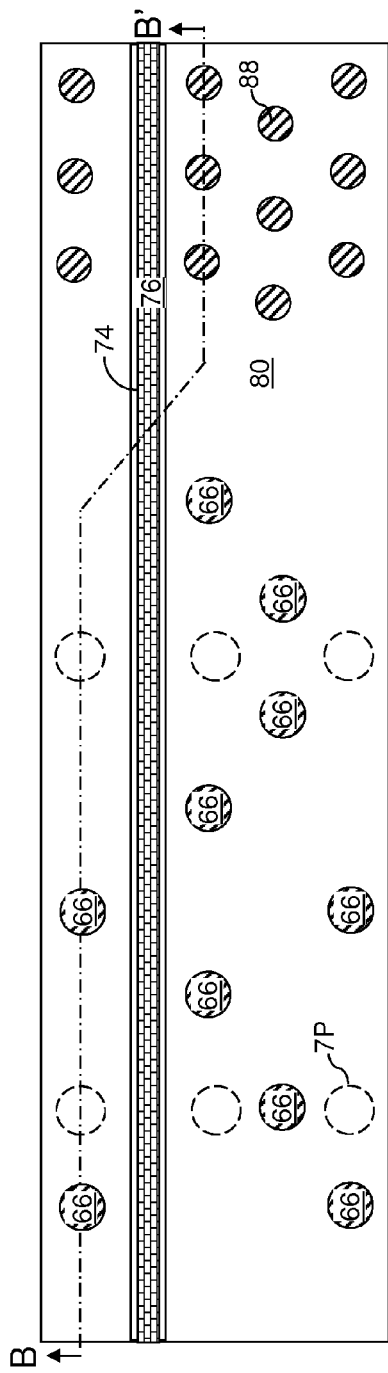
FIG. 33A is a top-down view of the second exemplary structure after formation of contact via structures according to the second embodiment of the present disclosure.
Figure 33B:
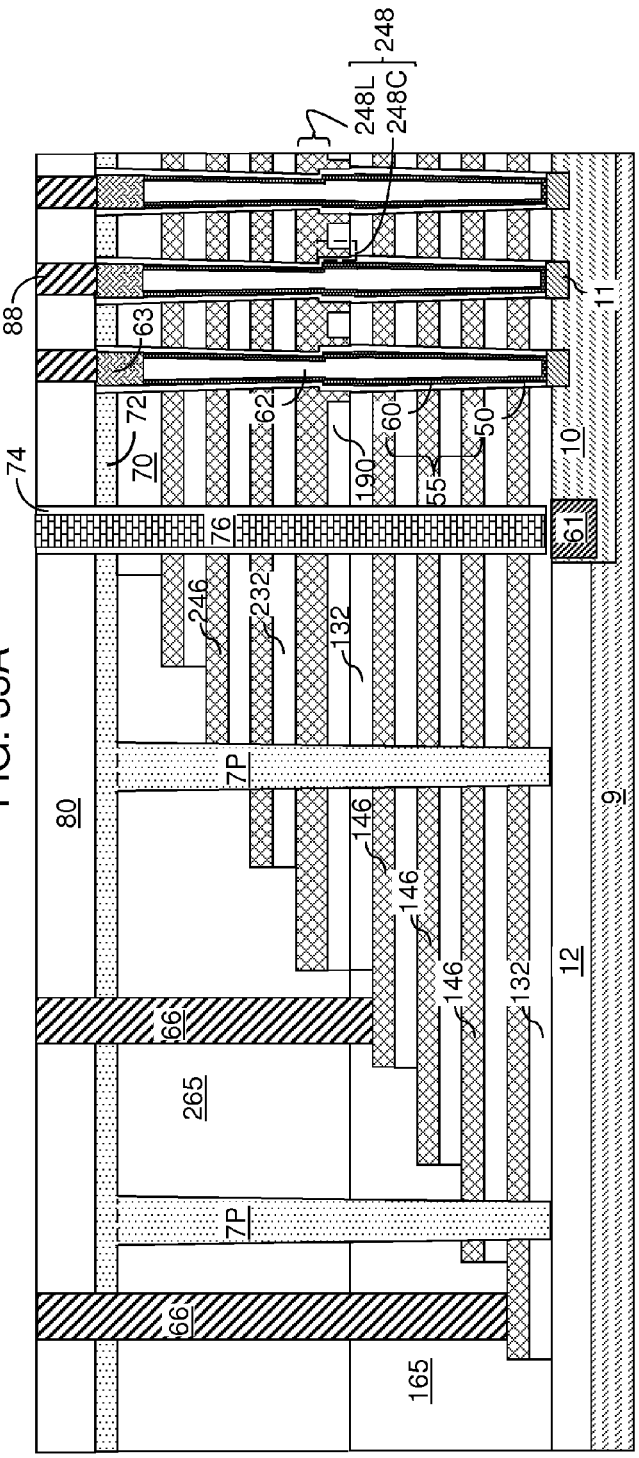
FIG. 33B is a vertical cross-sectional view of the second exemplary structure of FIG. 33A along the vertical plane B-B'.

Referring to FIGS. 33A and 33B, the processing steps of FIGS. 14A and 14B can be performed to form various contact via structures (76, 88, 66). The second exemplary structure can include a monolithic three-dimensional memory device. The monolithic three-dimensional memory device can include a lower stack structure (132, 146, 165) comprising a first alternating stack including first insulating layers 132 and first electrically conductive layers 146 and located over a substrate (9, 10); an upper stack structure (190, 232, 246, 248, 70, 72, 265) comprising a second alternating stack including second insulating layers 232 and second electrically conductive layers 246 and located over the lower stack structure (132, 146, 265); at least one memory stack structure 55 extending through the lower stack structure (132, 146, 165) and the upper stack structure (190, 232, 246, 248, 70, 72, 265); and an electrode 248 overlying the first electrically conductive layers 146 and underlying the second electrically conductive layers 246, and comprising a layer portion 248L having a uniform thickness and at least one collar portion 248C that laterally surrounds a respective memory stack structure 55 and having a greater vertical extent than the uniform thickness of the layer portion 248L.

In one embodiment, the topmost horizontal surface of the collar portion 248C and the top surface of the layer portion 248L can be within the same horizontal plane. In one embodiment, the bottommost horizontal surface of the collar portion 248L can be located within the horizontal plane including the interface between the lower stack structure (132, 146, 165) and the upper stack structure (190, 232, 246, 248, 70, 72, 265). In one embodiment, the collar portion 248C can have a vertical outer sidewall and a vertical inner sidewall. In one embodiment, the collar portion 248C can comprise the same material as the layer portion 248L. The layer portion 248L and the collar portion(s) 248C can be formed as a single continuous structure without any interface therebetween.

In one embodiment, the electrode 248 and the second conductive layers 246 can comprise the same conductive material. In one embodiment, the electrode 248 and the first and second conductive layers (146, 246) can comprise the same conductive material. In one embodiment, the electrode 248 can contact the top surface and at least one sidewall surface of a bottommost layer (i.e., the dielectric material layer 190) among the upper stack structure (190, 232, 246, 248, 70, 72, 265). The electrode 248 can be located within the upper stack structure (190, 232, 246, 248, 70, 72, 265).

Each second electrically conductive layer 246 that underlies at least another second electrically conductive layer 246 can laterally extend farther than any overlying layer among the second electrically conductive layers 246. Each first electrically conductive layer 146 that underlies at least another first electrically conductive layer 146 can laterally extend farther than any overlying layer among the first electrically conductive layers 146.

In one embodiment, the lower stack structure can further comprises a first dielectric material portion, e.g., the first retro-stepped dielectric material portion 165, located on, and over, first stepped surfaces of the first alternating stack (132, 146), and the upper stack structure can further comprises a second dielectric material portion, e.g., the second retro-stepped dielectric material portion 265, located on, and over, second stepped surfaces of the second alternating stack (232, 246). The first stepped surfaces and the second stepped surfaces can be located within a contact region, and a subset of control gate contact via structures 66 extends through the first dielectric material portion and the second dielectric material portion.

The thickness of the layer portion of the electrode (148/42, 248) may be a uniform thickness, the first and the second electrically conductive layers (146, 246) may comprise word lines/control gate electrodes which have no collar portion and a uniform thickness which is the same as or different from the uniform thickness of the electrode (148/42, 248).

In one embodiment, the monolithic three-dimensional memory structure comprises a monolithic three-dimensional NAND memory device. The first and second electrically conductive layers can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

The greater vertical extent of the collar portion (42, 248C) of the joint region electrode (148/42, 248) of the present disclosure than the thickness of the layer portion (148, 248L) of the joint region electrode provides the benefit of an extension of the region within each semiconductor channel that is controlled within the joint region. Thus, a tighter control of the semiconductor channel is provided in the joint region, thereby increasing the different between the on-current and the off-current of the respective semiconductor channel. In other words, the joint region electrode (148/42, 248) maybe a so-called dummy electrode to which a voltage is applied during the operation of the NAND device, but no charge is stored in the joint portion of the memory film 50 of the memory stack structures 55 in the same horizontal device level as the joint region electrode (148/42, 248). The applied voltage to this electrode enhances the depletion region in the channel 60 in the joint region to facilitate transport of the charge carriers in the channel between the upper and lower portions of the channel. The collar portion enhances the depletion region in the joint region of the channel compared to just the layer portion of the same electrode because the collar portion of each joint electrode has a larger thickness and thus a greater facing area with the channel than just the layer portion of the same electrode. While vertical stacks of two stack structures are illustrated and described above, it should be understood that more than two stacks, such as three to ten stacks, such as four to six stacks, may be formed using the above described method.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
 a lower stack structure comprising a first alternating stack including first insulating layers and first electrically conductive control gate layers and located over a substrate;
 an upper stack structure comprising a second alternating stack including second insulating layers and second electrically conductive control gate layers and located over the lower stack structure;
 a memory stack structure extending through the lower stack structure and the upper stack structure; and
 an electrode overlying the first electrically conductive layers and underlying the second electrically conductive layers, and comprising a layer portion having a thickness and a collar portion that laterally surrounds the memory stack structure and having a greater vertical extent than the thickness of the layer portion.

2. The monolithic three-dimensional memory device of claim 1, wherein a topmost horizontal surface of the collar portion is located above a horizontal plane including a top surface of the layer portion of the electrode.

3. The monolithic three-dimensional memory device of claim 2, wherein the topmost horizontal surface of the collar portion is within a same horizontal plane as a top surface of a topmost insulator layer within the lower stack structure.

4. The monolithic three-dimensional memory device of claim 2, wherein a bottommost horizontal surface of the collar portion is located above a horizontal plane including a bottom surface of the layer portion.

5. The monolithic three-dimensional memory device of claim 2, wherein the collar portion has an upper tapered sidewall and a lower tapered sidewall having a less taper angle than the upper tapered sidewall.

6. The monolithic three-dimensional memory device of claim 2, wherein the collar portion comprises a doped semiconductor material.

7. The monolithic three-dimensional memory device of claim 6, wherein the layer portion comprises another doped semiconductor material having a same or a different material composition than the semiconductor material of the collar portion.

8. The monolithic three-dimensional memory device of claim 2, wherein the electrode comprises a different material than the first electrically conductive layers.

9. The monolithic three-dimensional memory device of claim 1, wherein a topmost horizontal surface of the collar portion and a top surface of the layer portion are within a same horizontal plane.

10. The monolithic three-dimensional memory device of claim 9, wherein a bottommost horizontal surface of the collar portion is located within a horizontal plane including an interface between the lower stack structure and the upper stack structure and below a bottom of the layer portion.

11. The monolithic three-dimensional memory device of claim 9, wherein the collar portion has a vertical outer sidewall and a vertical inner sidewall.

12. The monolithic three-dimensional memory device of claim 9, wherein the collar portion comprises a same conductive material as the layer portion.

13. The monolithic three-dimensional memory device of claim 9, wherein the electrode contacts a top surface and a sidewall surface of a bottommost layer in the upper stack structure.

14. The monolithic three-dimensional memory device of claim 1, wherein the memory stack structure comprises, from inside to outside:
a semiconductor channel;
a tunneling dielectric layer laterally surrounding the semiconductor channel; and
charge storage regions laterally surrounding the tunneling dielectric layer.

15. The monolithic three-dimensional memory device of claim 14, wherein the electrode is a dummy word line to which voltage is applied to generate a depletion region in a joint region of the semiconductor channel between the upper stack and the lower stack.

16. The monolithic three-dimensional memory device of claim 1, wherein:
each second electrically conductive layer that underlies at least another second electrically conductive layer laterally extends farther than any overlying layer among the second electrically conductive layers;
each first electrically conductive layer that underlies at least another first electrically conductive layer laterally extends farther than any overlying layer among the first electrically conductive layers;
the lower stack structure further comprises a first dielectric material portion located on, and over, first stepped surfaces of the first alternating stack;
the upper stack structure further comprises a second dielectric material portion located on, and over, second stepped surfaces of the second alternating stack;
the first stepped surfaces and the second stepped surfaces are located within a contact region; and
a subset of control gate contact via structures extends through the first dielectric material portion and the second dielectric material portion.

17. The monolithic three-dimensional memory device of claim 1, wherein:
the thickness of the layer portion of the electrode comprises a uniform thickness; and
the first and the second electrically conductive control gate layers have a uniform thickness and no collar portion.

18. The monolithic three-dimensional memory device of claim 1, wherein:
the monolithic three-dimensional memory structure comprises a monolithic three-dimensional NAND memory device;
the first and second electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *